United States Patent
Kats et al.

(10) Patent No.: US 9,324,893 B1
(45) Date of Patent: Apr. 26, 2016

(54) PORTABLE SOLAR POWER SYSTEM AND METHOD FOR THE SAME

(71) Applicant: SolAero Technologies Corp., Albuquerque, NM (US)

(72) Inventors: Michael Kats, Rockaway, NJ (US); Emrah Kulunk, Albuquerque, NM (US); James Sherman, Hillsborough, NJ (US); Daniel Aiken, Cedar Crest, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 281 days.

(21) Appl. No.: 14/102,053

(22) Filed: Dec. 10, 2013

(51) Int. Cl.
*H02N 6/00* (2006.01)
*H01L 31/042* (2014.01)
*H02S 30/20* (2014.01)
*H02J 7/00* (2006.01)

(52) U.S. Cl.
CPC .......... *H01L 31/0422* (2013.01); *H01L 31/045* (2013.01); *H02J 7/0052* (2013.01)

(58) Field of Classification Search
CPC ......... H02S 20/30; H02S 20/32; H02S 30/10; H02S 30/20
See application file for complete search history.

(56) References Cited

U.S. PATENT DOCUMENTS

| | | | |
|---|---|---|---|
| 5,969,501 A * | 10/1999 | Glidden | F24J 2/523 320/101 |
| 7,795,568 B2 | 9/2010 | Sherman | |
| 8,193,477 B2 | 6/2012 | Sherman et al. | |
| 8,466,399 B1 | 6/2013 | Sherman | |
| 8,507,837 B2 | 8/2013 | Sherman et al. | |
| 8,513,514 B2 | 8/2013 | Sherman | |
| 2010/0000592 A1* | 1/2010 | Ko | F24J 2/5266 136/246 |
| 2010/0102202 A1* | 4/2010 | Sherman | F24J 2/38 250/203.4 |
| 2011/0155217 A1* | 6/2011 | Yang | H01L 31/02168 136/246 |
| 2012/0206087 A1 | 8/2012 | Carpoff | |
| 2012/0266938 A1* | 10/2012 | Goei | F24J 2/38 136/246 |
| 2013/0037080 A1* | 2/2013 | Helfan | F24J 2/523 136/245 |

* cited by examiner

Primary Examiner — Eli Mekhlin

(57) ABSTRACT

A portable solar power system and a method for deploying the portable solar power system are disclosed. The portable solar power system may include a foldable plate including a non-foldable portion and at least one foldable portion with respective to the non-foldable portion, both of which have respective surfaces on which a solar cell array is mounted; a rotating mechanism for rotating the foldable plate at least in a generally horizontal plane; and a mast for supporting at least a part of the rotating mechanism and the foldable plate.

20 Claims, 19 Drawing Sheets

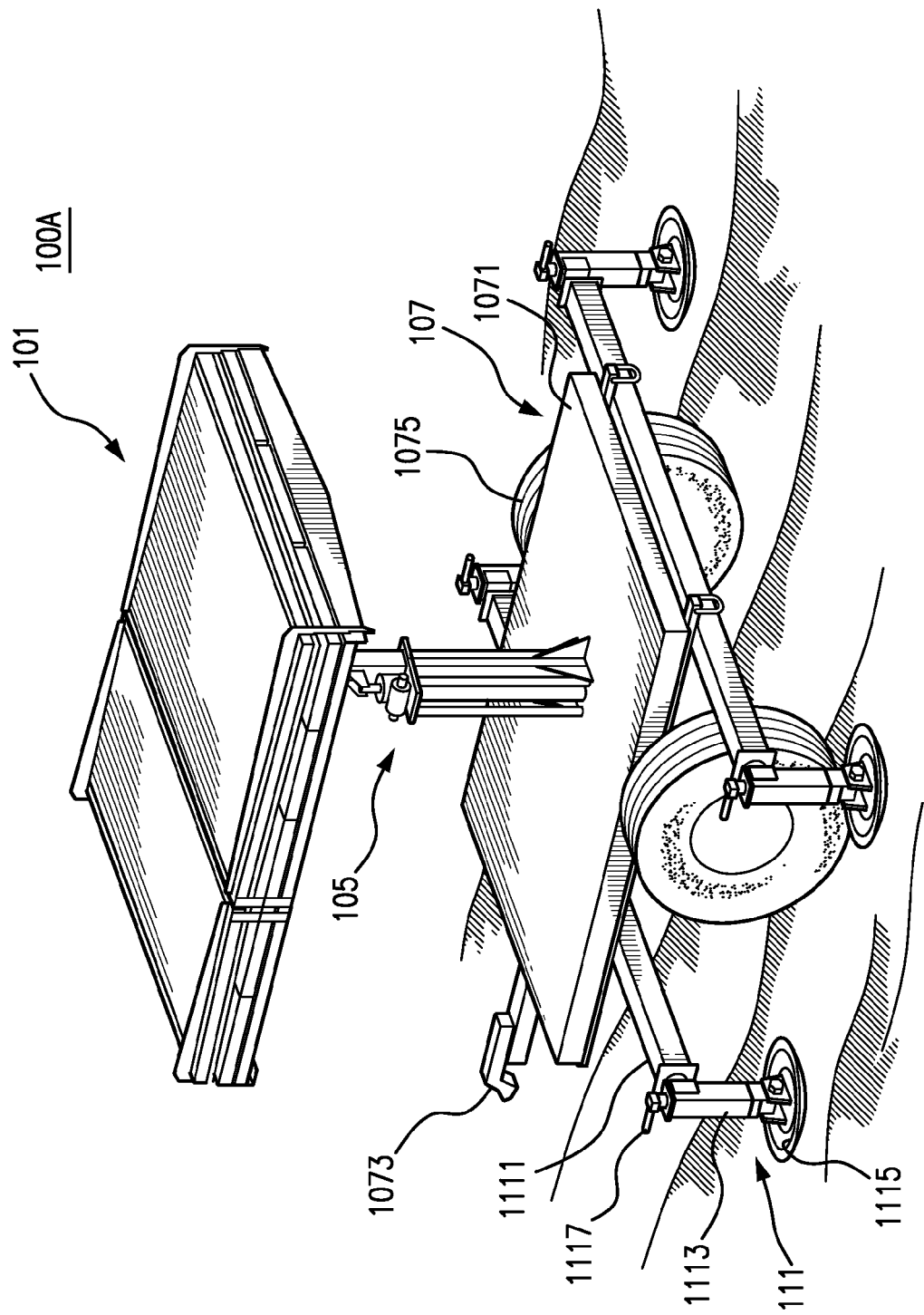

PORTABLE SOLAR POWER SYSTEM AND METHOD FOR THE SAME

GOVERNMENT RIGHTS STATEMENT

This invention was made with government support under Contract No. N00014-12-D-0251 awarded by the Office of Naval Research. The Government has certain rights in the invention.

BACKGROUND OF THE INVENTION

1. Field of the Invention

The present invention relates to a portable solar power system and a method for the portable solar power system.

2. Description of the Related Art

Standalone portable solar power systems have been proposed to conveniently provide solar power supply. In U.S. application Ser. No. 13/397,874, a portable solar power system is proposed and includes a trailer and solar panels mounted on rotating beams on the trailer. The trailer can be towed and the first and second groups of solar panels are locked in vertically orientation for transportation. At use site, the trailer can be positioned with the rotating beams parallel with the equator and the solar panels rotated to captures the maximum amount of sunlight.

However, the sun rises from east and goes down at west, and the positions of the sun during the course of day are not strictly aligned at east-west direction, therefore, the solar power system according to U.S. application Ser. No. 13/397,874 inefficiently tracks the sun particularly in view of that the rotating beams are positioned parallel with the equator so that the orientations of the solar panels can only adjusted along a longitudinal direction. When sun rises from the ground at morning or stays near the ground at afternoon, such a power system may fail to effectively track the sun.

On the other hand, portable solar power systems often need to operate in remote locations with uneven terrain. The solar power system according to U.S. application Ser. No. 13/397,874 fails to be adaptable to be deployed at locations with various terrain conditions and topographies.

Thus, a portable solar power system which can effectively and efficiently track the sun and adapted to various terrain conditions is needed in the art.

SUMMARY

According to an aspect of an embodiment of the present disclosure, there is provided a portable solar power system, comprising: a foldable plate including a non-foldable portion and at least one foldable portion with respective to the non-foldable portion, both of which have respective surfaces on which solar cells of a solar cell array are mounted and respective opposite surfaces; a rotating mechanism for rotating the foldable plate in at least one plane; a mast for supporting at least a part of the rotating mechanism and the foldable plate, the mast including a first portion and a second portion coupled to the first portion; and a support and transport platform for supporting the foldable plate, the rotating mechanism and the mast, and for motion of the portable solar power system.

According to another aspect of an embodiment of the present disclosure, there is provided an automated method of operating a portable solar power system, the portable solar power system comprising a portable photovoltaic solar cell array that is capable of tracking the sun, the solar cell array including a plurality of solar cells, the system further comprising two motor drives each of which is operable to adjust a position of the solar cell array about a respective different axis, the array and motor drives mounted on a vehicle trailer, the method comprising: (a) deploying the trailer at a location where it is deployed to operate; (b) determining the latitude and longitudinal position of the trailer; (c) predicting the positions of the sun during the course of the day using a software algorithm based upon the day and the latitude and longitudinal position of the trailer; (d) determining the respective actuations for the respective motor drives corresponding to the solar cell array being substantially aligned with the sun during the course of the day; and (e) actuating the first and second motor drives during the course of the day based on the determined actuations, so that the array is substantially aligned with the sun during the course of the day.

According to an implementation, the method may further comprise: (f) sampling an output characteristic of the array in the course of the day so as to monitoring the operation performance of the solar cell array.

Further aspects, features and advantages of the present invention will be understood from the following description with reference to the drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1A is a simplified perspective view schematically illustrating a portable solar power system according to an embodiment of the present disclosure.

DESCRIPTION OF THE EMBODIMENTS

Figure 1B:
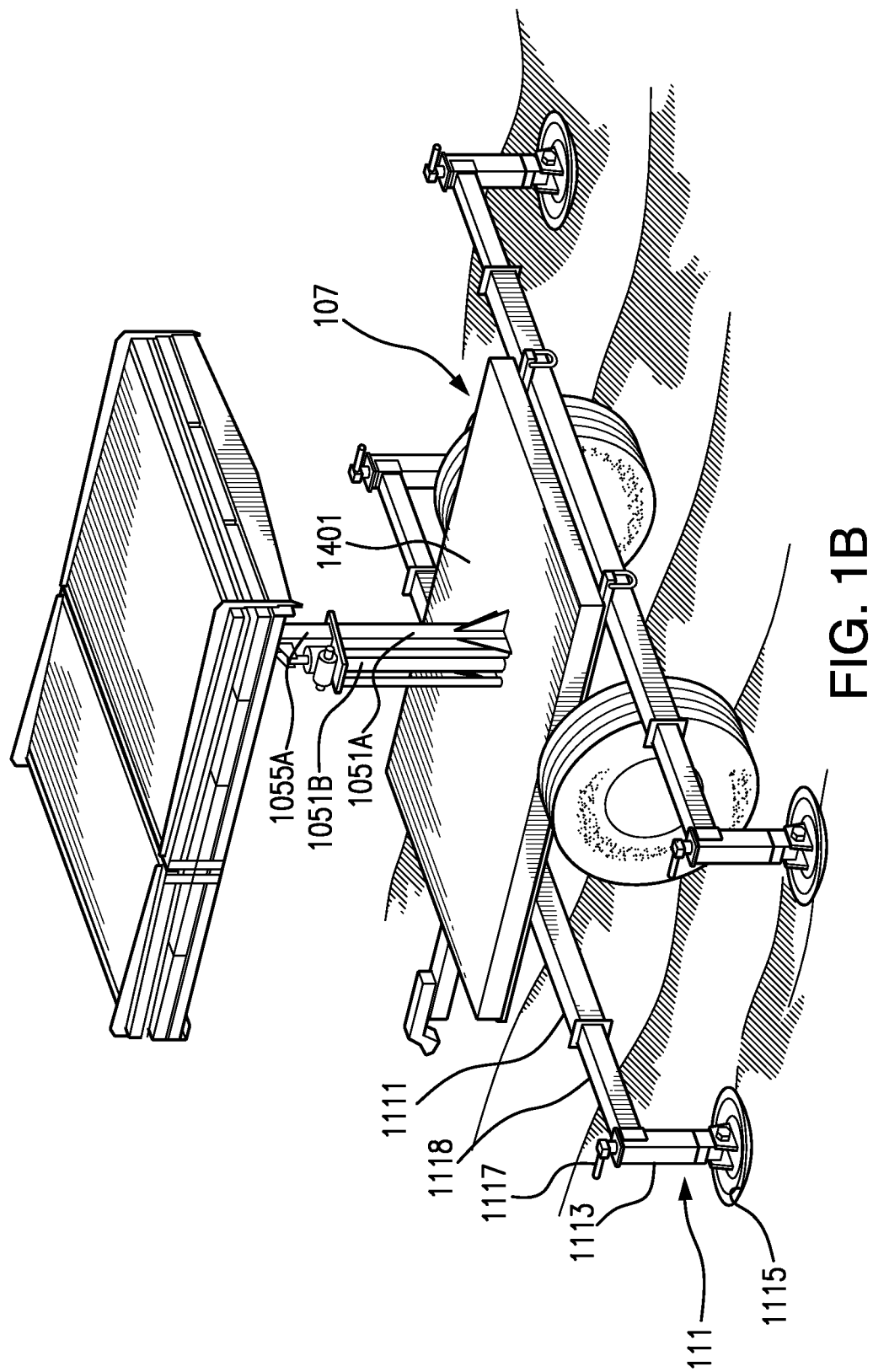
FIG. 1B is a simplified perspective view further schematically illustrating the portable solar power system of FIG. 1A.

Embodiments of the present disclosure will be described in detail below with reference to the drawings. Note that similar reference numerals are used to refer to similar elements throughout the drawings, and thus repetitive descriptions thereof are omitted.

FIG. 1A is a simplified perspective view schematically illustrating a portable solar power system 100 according to an embodiment of the present disclosure.

The solar power system 100 includes a foldable plate 101 on which a solar cell array is mounted, a rotating mechanism 103 (see, FIG. 3) for rotating the foldable plate in at least one plane, a mast 105 for supporting at least a part of the rotating mechanism 103 and the foldable plate 101, and a support and transport platform 107 for supporting the foldable plate, the rotating mechanism and the mast and for motion of the portable solar power system. The foldable plate 101, the rotating mechanism 103, and the mast 105 will be described in detail later.

In this embodiment, the support and transport platform 107 can be implemented as a trailer, as shown in FIG. 1A. The trailer 107 may include a base 1071 on and above which the mast, the rotating mechanism and the foldable plate are mounted; a trailer hitch 1073 coupled to the base 1071 for towing the trailer; wheels 1075 operatively coupled to the base; and adjustable ground supports 111 coupled to the base 1071 for supporting the trailer when the trailer is in a standalone state. As shown in FIG. 1A, the trailer is shown in a standalone state, that is, it is not drawn by a vehicle. The ground supports can be stamped onto the ground to firmly hold the solar power system, for example, to make the base 1071 substantially horizontally placed.

In an embodiment, the adjustable ground supports 111 each may include a fix rod 1111 coupled to the base 1071, a support rod 1113 coupled to the fix rod 1111 and is capable of being bended with respect to the fix rod so as to support the trailer, as shown in FIG. 1A. In some examples, the support rod 1113 may further include a support pad 1115 for increasing contact area of the support rod 1113 and the ground. The support rod 1113 can be adjustable so as to lift the trailer off the ground. In some further examples, the ground support 111 may further include adjust means 1117 for adjusting the stroke of the support rod 1113 so as to lift the trailer off the ground. In the drawings, the adjust means 1117 is simply illustrated as a handle, however, it should be understood that the various the adjust means 1117 can be implemented.

FIG. 1B is a simplified perspective view schematically further illustrating the portable solar power system 100A of FIG. 1A. As shown, the fix rods 1111 each includes an extendable portion 1118 which is coupled to a fixed portion of the fix rod 1111 and can be extended from the fixed portion. The support rod 113 is coupled to the extendable portion 1118 of the fix rod 1111.

It is to be noted that the present invention should not be limited to trailer implementations, and the support and transport platform 107 can also be embodied as, for example, a self-propelled vehicle which includes the base 1071 on and above which the mast, the rotating mechanism and the foldable plate are mounted.

In some embodiments, the solar cells of the array can be silicon solar cells. The silicon solar cell may include, for example, a photo-electric conversion layer made of poly silicon, single-crystalline silicon, micro-crystalline silicon, etc. In some other embodiments, the photo-electric conversion layer of the solar cell can be implemented with other materials, for example, compound semiconductors.

Figure 2:
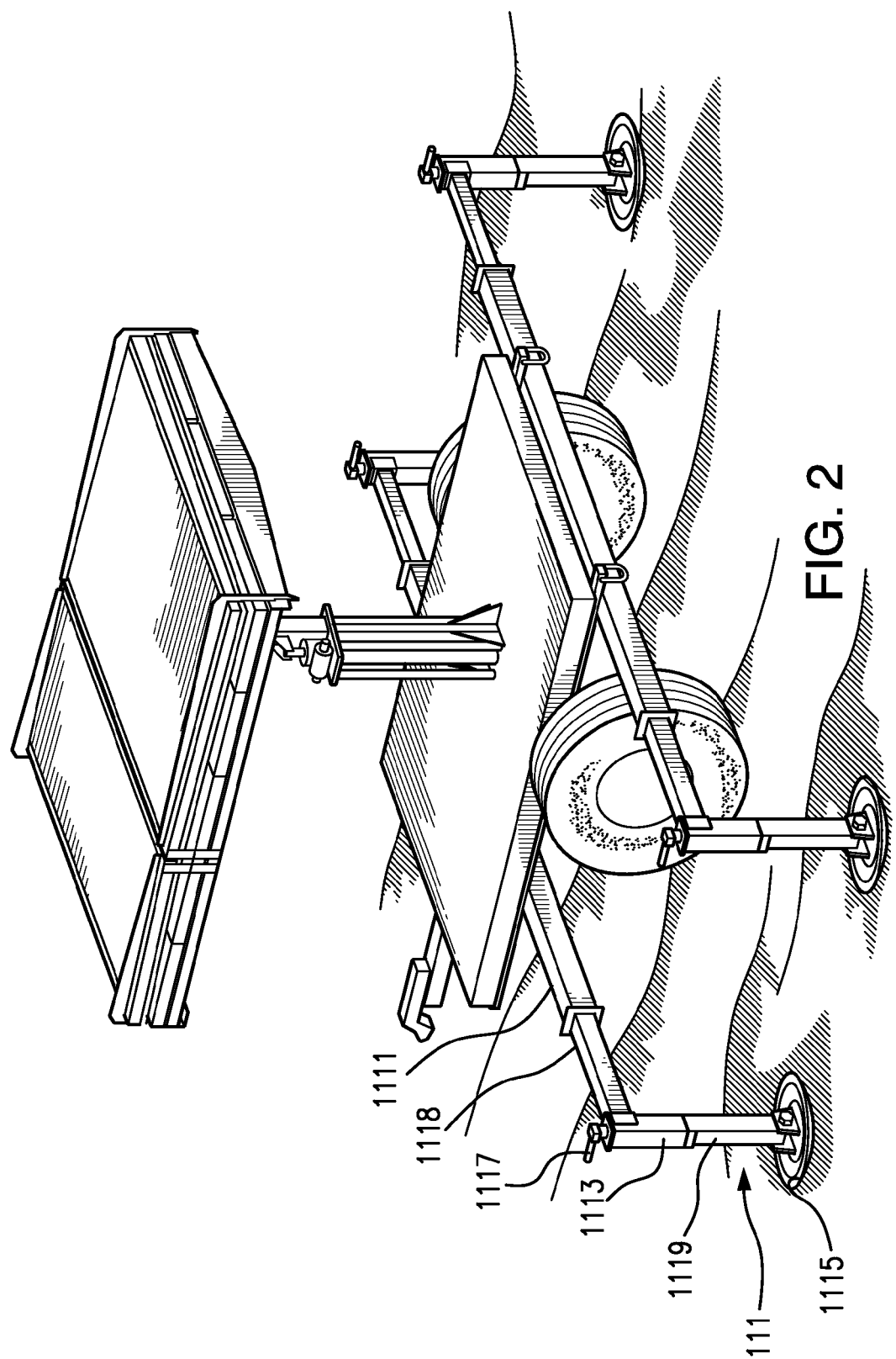
FIG. 2 is a perspective view schematically illustrating the portable solar power system of FIG. 1B in which the support rods of the ground supports are further extended to lift the trailer off the ground.

FIG. 2 is a perspective view schematically illustrating the portable solar power system of FIG. 1B in which the support rods of the ground supports are further adjusted to lift the trailer off the ground. The support rod 1113 may include a fixed portion which is also indicated by the reference number 1113, and an extendable portion 1119 coupled to the fixed portion, to which the ground pad 1115 is coupled. Further, the support rods 1113 can be independently adjusted so as to substantial horizontally place the base 107.

Two wheels and four ground supports are illustrated in FIGS. 1A and 1B, however, it is to be noted that the numbers of the wheels and the numbers of the ground supports are not limiting.

Figure 3:
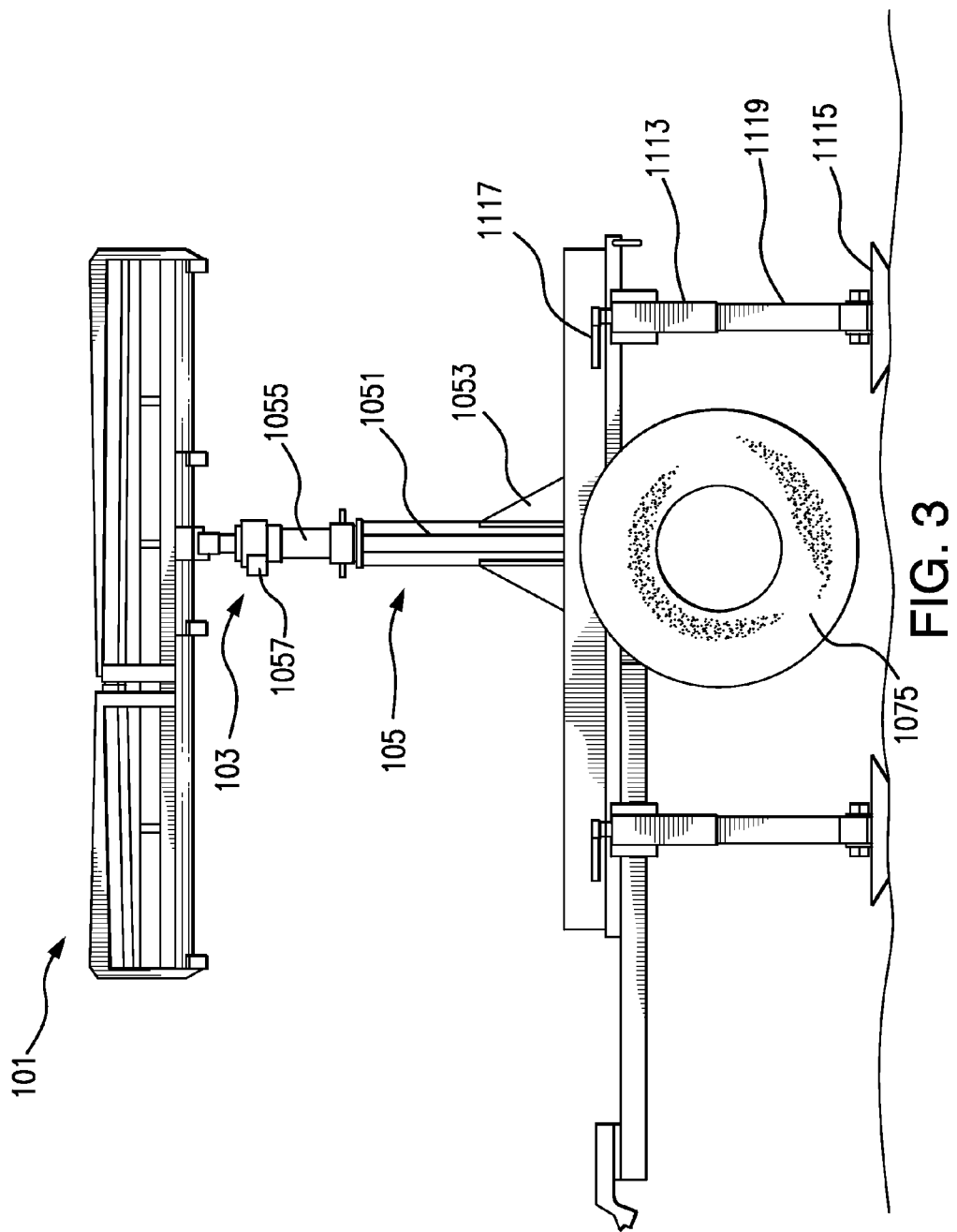
FIG. 3 is a side view of the portable solar power system of FIG. 2 in which the mast is set in an initial state.
Figure 4:
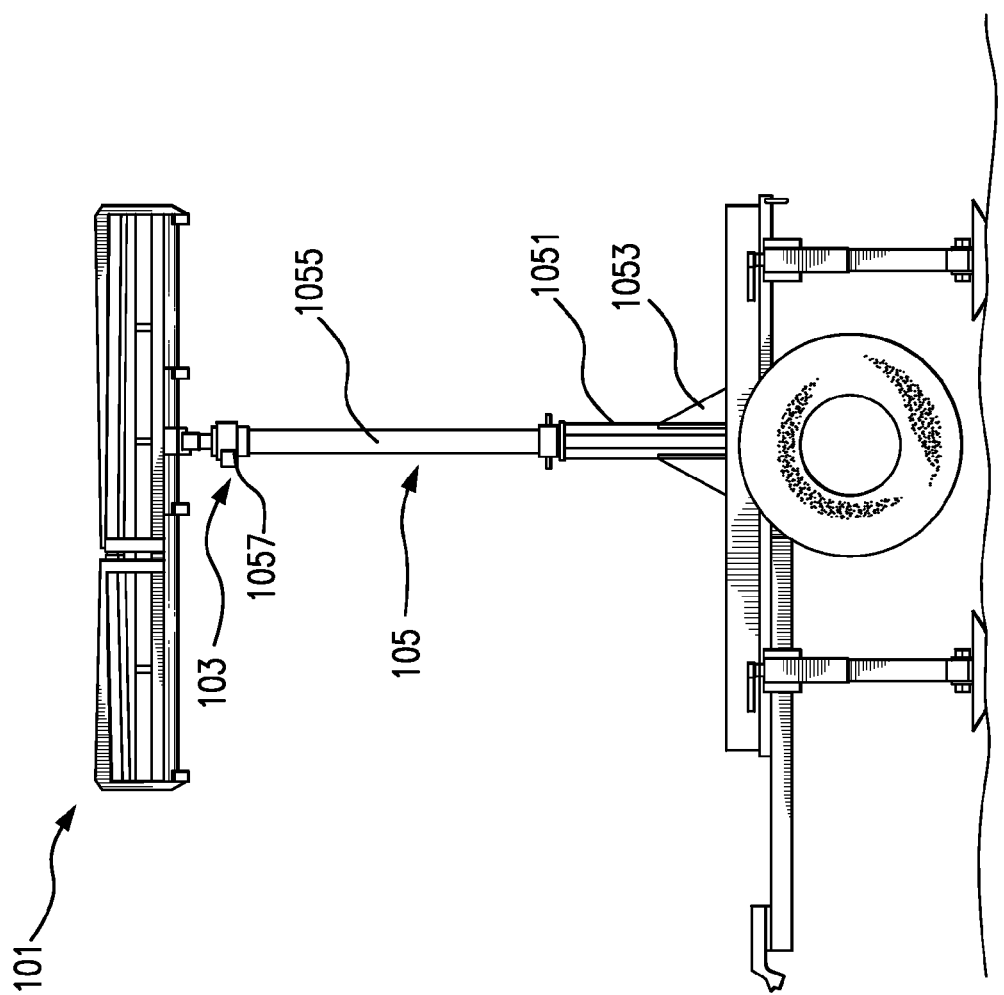
FIG. 4 is a side view of the portable solar power system of FIG. 2 in which the mast is set in an elevated state.

FIG. 3 is a side view of the portable solar power system of FIG. 2 in which the mast 105 and the foldable solar cell plate 101 are set in a stowed state. In this embodiment, the mast 105 can be an elevating mast which is capable of reciprocating up and down the at least a part of the rotating mechanism and the foldable plate. In this stowed state, the foldable solar cell plate 101 is folded. And, in such a state, the mast 105 preferably is kept in its original state, that is, the foldable solar cell plate 101 is not elevated. FIG. 3 illustrates a case where after the portable solar power system is deployed at a desired location where it is to operate, the ground supports are adjusted so as to keep the platform substantially horizontal. FIG. 4 is a side view of the portable solar power system of FIG. 2 in which the mast is set in an elevated state.

As shown in FIGS. 3 and 4, the mast 105 may include a first portion 1051, a second portion 1055 coupled to the first portion. In this embodiment, the second portion 1055 of the mast 105 is capable of being reciprocated respective to the first portion so that the mast is capable of reciprocating up and down the at least a part of the rotating mechanism and the foldable plate. The mast 105 further includes an actuator (1059 in FIG. 7) for actuating the movable second portion thereof. In an implementation, the first portion 1055 of the mast 105 may be directly coupled or fixed to the base 1071 of the trailer 107.

In some other implementations, the second portion 1055 of the mast 105 can be fixed to the first portion 1051 of the mast, or even can be integrally formed. That is, the invention shall not be limited to a solution with an elevating mast.

In a preferred implementation, the mast 105 may further include reinforce plates 1053 fixed onto the first portion and the support object for the mast 105 which may be, for example, the base 1071. As shown, the rotating mechanism 103, to which the foldable solar cell plate 101 is coupled, can be coupled to the mast 105, and in this embodiment, be coupled to the top end 1057 of the movable second portion 1055 which is shown as having been elevated in FIG. 4.

Figure 5:
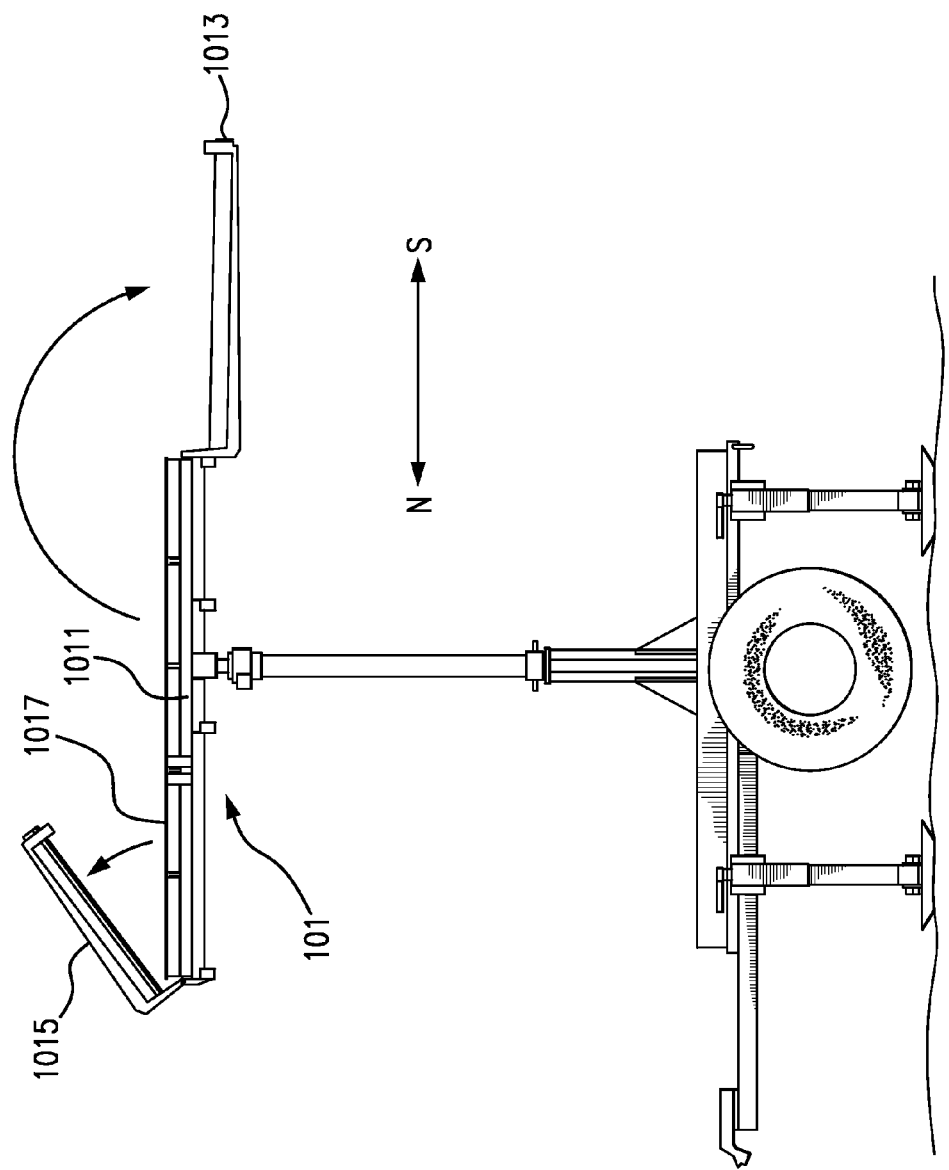
FIG. 5 is a side view of the portable solar power system of FIG. 2 in which the foldable plate on which the solar cells are mounted is being unfolded.

After being elevated, the foldable solar cell plate 101 is unfolded, as shown in FIG. 5. FIG. 5 is a side view of the portable solar power system of FIG. 2 in which the foldable plate 101, on which a solar cell array including a plurality of solar cells is mounted, is being unfolded. As shown, the foldable plate 101 includes a non-foldable portion 1011 and at least one foldable portion 1013/1015 with respective to the non-foldable portion 1011. Both of the non-foldable portion 1011 and the foldable portion(s) 1013/1015 have respective surfaces on which the solar cells 200 (see, FIG. 9) of a solar cell array 1017 are mounted, and respective opposite surfaces to the cell-mounted surface. The solar cell plate 101 may further include frames or ridges (not specifically indicated in FIG. 5) fixed onto the opposite surfaces of the portions thereof.

Two foldable portions 1013 and 1015 are shown in FIG. 5, and the first foldable portion 1013 is shown as having been fully unfolded, while the second foldable portion is shown as still being unfolded. The foldable portions 1013 and 1015 are illustrated as being asymmetric in this embodiment; however, the present invention is not intended to be limited to such an embodiment. Furthermore, it is to be noted that such an embodiment is only for illustrative purpose, and there is no particular limitation on the opening order of the foldable portions.

The part of the solar cell array which is mounted on the stationary portion 1011 and the parts of the solar cell array which are mounted on the foldable portions 1013 and 1015 can face each other when the foldable portions are folded, as shown in FIG. 4.

Further, it is preferable to position the solar power system so that a longitudinal axis (long axis) of the array is disposed at north-south direction, that is, along a longitude direction, as shown in FIG. 5. That is to say, it is preferable to position the trailer such that the connection line between two opposing wheels is arranged substantially in East-West direction, so as to facilitating the tracking the sun by the array. However, as would be obviously known from the following description, the present invention should not be limited to such an arrangement since the solar cell plate 101 can be adjusted in two different (substantially orthogonal) planes according to various embodiments of the present disclosure.

Figure 6:
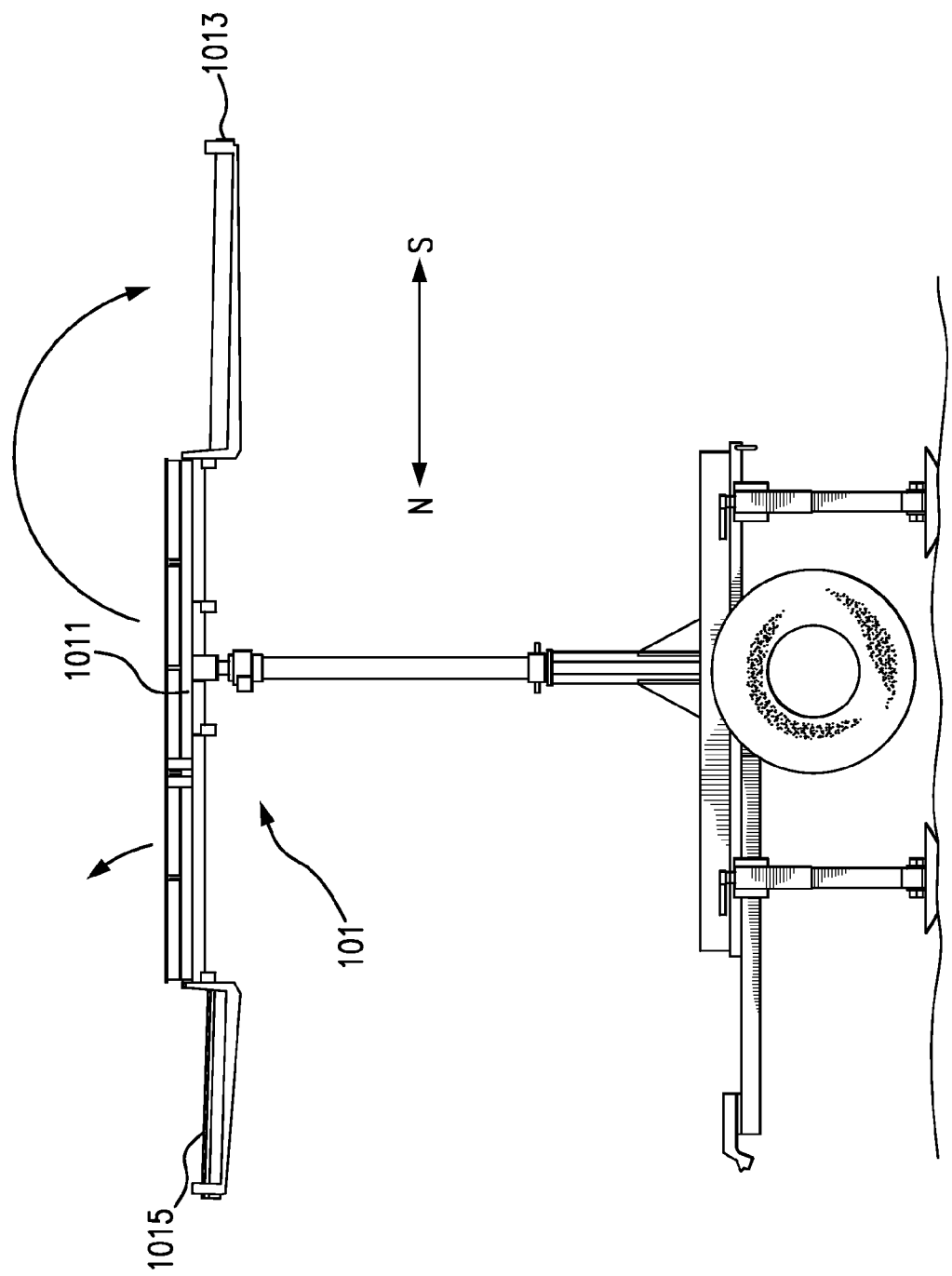
FIG. 6 is a side view of the portable solar power system of FIG. 2 in which the foldable plate on which the solar cells are mounted has been unfolded into deployed state.

FIG. 6 is a side view of the portable solar power system of FIG. 2 in which the foldable plate on which the solar cells are mounted has been unfolded to expose the front surface of the solar cell array to the ambient environment. That is, the foldable solar cell plate, and thus, the solar cell array, has been transferred into a deployed state. In such a deployed state, the solar cell plate 101 is unfolded into being substantially parallel to the base 1071 and thus the solar cell array is exposed to the ambient environment. The solar cell array in such a deployed state can also have a corresponding deployed position at which the solar cell array has not be further adjusted to track the sun.

Figure 7:
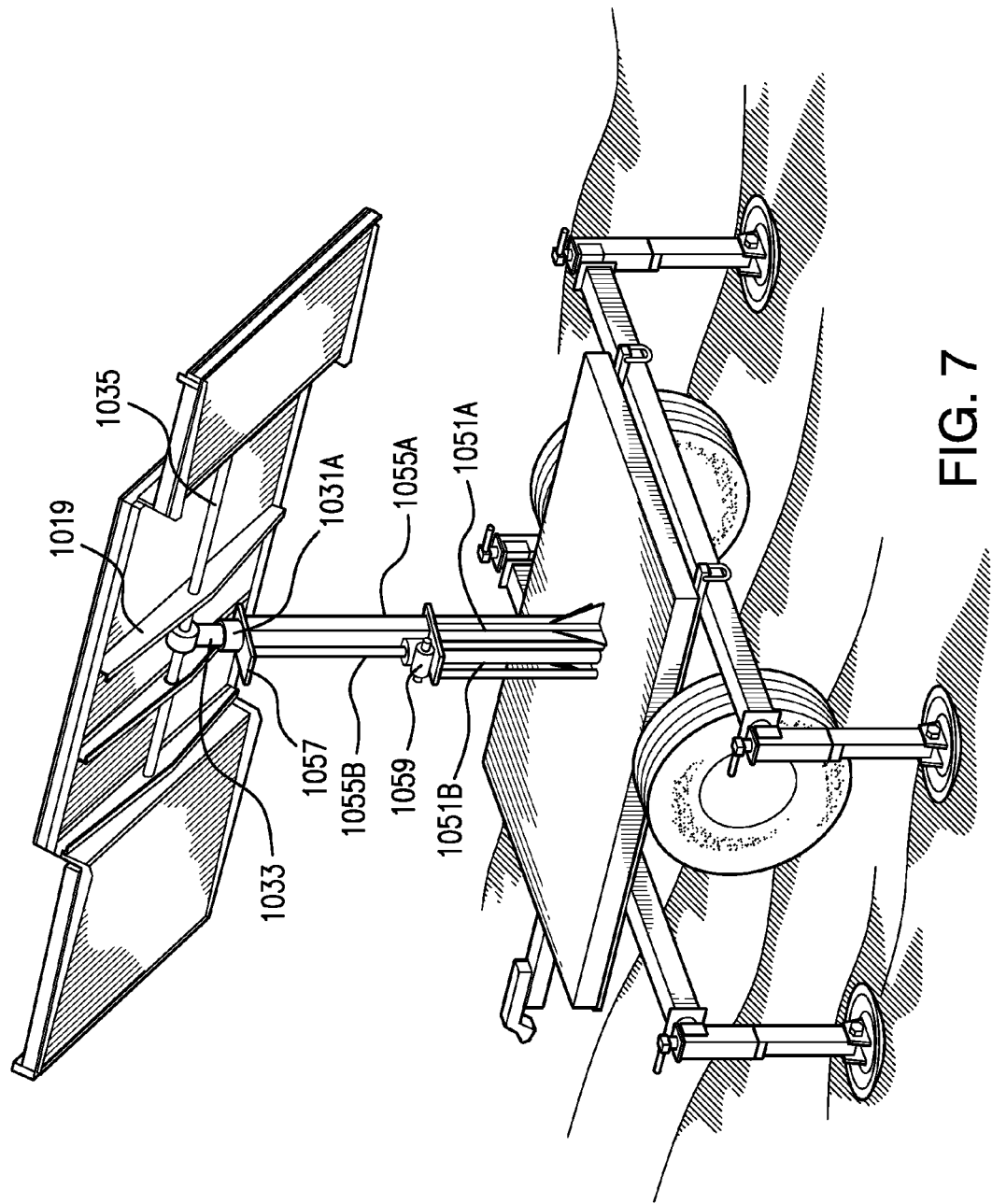
FIG. 7 is a simplified perspective view schematically illustrating a portable solar power system in an operating state according to the embodiment of the present disclosure.

FIG. 7 is a simplified perspective view schematically illustrating a portable solar power system in an operating state according to an embodiment of the present disclosure. As shown, the rotating mechanism 103 may include a stationary first portion 1031 which can be coupled to the second portion 1055 of the mast 105, for example, at the end portion 1057 of the second portion 1055 of the mast 105. The rotating mechanism 103 may further include a second portion 1033 coupled to the stationary first portion 1031 and capable of being rotated about a vertical axis (first axis) thereof with respective to the first portion 1031. The rotating mechanism 103 may further includes a rotatable beam 1035 coupled to the rotatable second portion 1033, which is capable of being rotated about a longitudinal axis (second axis) thereof with respective to the second portion 1033 and is fixed to a ridge 1019 fixed onto the opposite surface of the non-foldable portion of the foldable plate 101. The rotating mechanism 103 may further include actuators 1037 and 1039 (see, FIG. 8) for actuating the rotatable second portion 1033 and the rotatable beam 1035 to rotate, respectively. The actuators 1037 and 1039 can be implemented with motor drives, for example, step motors. Thus, the orientations in both horizontal and vertical directions of the foldable solar cell plate 101, and thus, the orientations of the solar cell array mounted thereon, can be adjusted by the operation of the rotating mechanism 103. Therefore, the foldable plate is capable of being controlled so that the solar cell array is approximately oriented perpendicularly to sunlight in the case the foldable plate is fully unfolded.

In the embodiments of FIGS. 1A, 1B, 2, and 7, the first portion 1051 of the mast 105 may include two separate hollow columns 1051A and 1051B, and the second portion 1055 of the mast 105 may include two separate shafts 1055A and 1055B partly fitted into the separate columns 1051A and 1051B, respectively. There are no particular limitations on the geometries of the columns and shafts although the column 1051A and the shaft 1055A are illustrated as quadrangular prisms while the column 1051B and the shaft 1055B are illustrated as cylinders. The mast 105 may further include an actuator 1059, which can be implemented with a motor drive, for example. Also, the top end portion of the second portion 1055 can be implemented as a plain plate 1057, as shown in FIG. 7, on which the stationary first portion 1031 of the rotating mechanism 103 can be coupled.

Figure 8:
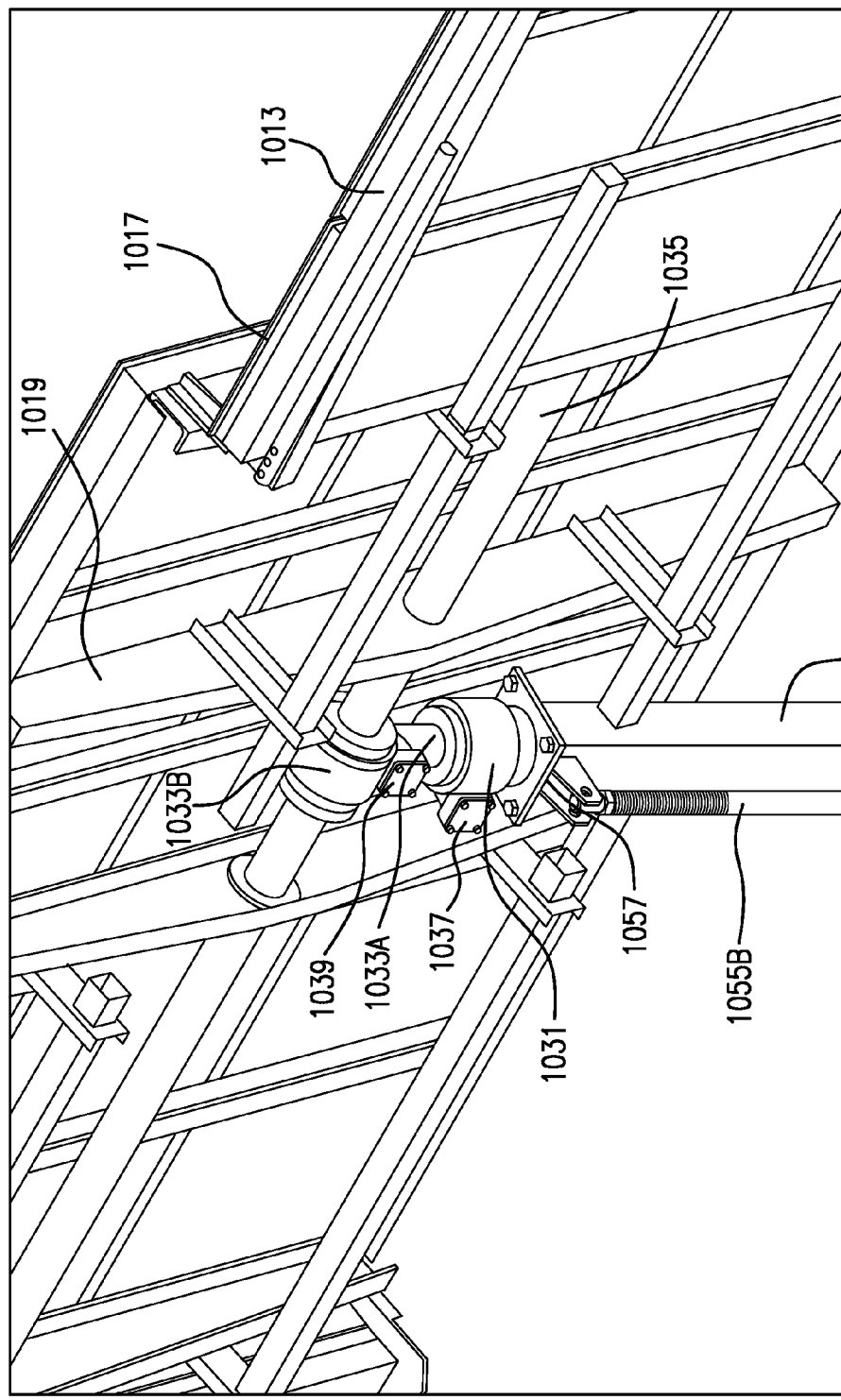
FIG. 8 is a partial enlarged view schematically illustrating a rotating mechanism according to an embodiment of the present disclosure.

FIG. 8 is a partial enlarged view schematically illustrating a rotating mechanism 103, as well as some details on the opposite surface of the unfolded solar cell plate 101, according to an embodiment of the present disclosure. In this embodiment, the first portion 1031 of the rotating mechanism 103 has a cylindrical shape, and the rotatable second portion 1033 thereof includes a cylindrical shaft coupled to the first portion 1031, and a cylindrical body 1033B to the side surface of which the cylindrical shaft 1033A is coupled. The symmetric axis (longitudinal axis) of the cylindrical shaft 1033A may be vertical to that of the cylindrical body 1033B. The rotatable second portion 1033 can be rotated around its rotating axis (a first rotating axis which can be, for example, the symmetric axis thereof), with respect to the first portion 1031.

A rotatable beam 1035 is coupled to the cylindrical body 1033B, preferably along the longitudinal axis of the cylindrical body 1033B. The rotatable beam 1035 is coupled or fixed to the ridges or frame 1019 on the opposite surface of the solar plate 101. The rotatable beam 1035 is capable of being rotated around its rotating axis (a second rotating axis which can be, for example, the symmetric axis thereof), which is different from, preferably substantially perpendicular to, the rotating axis of the rotatable second portion 1033 of the rotating mechanism 103. It is to be noted that the shapes of the components are just exemplary and illustrative, and not for limiting the scope of the invention in any sense.

As shown in FIG. 8, the rotating mechanism 103 may further include actuators (for example, motor drives) 1037 and 1039 for rotating the second portion and the rotatable beam.

Figure 9A:
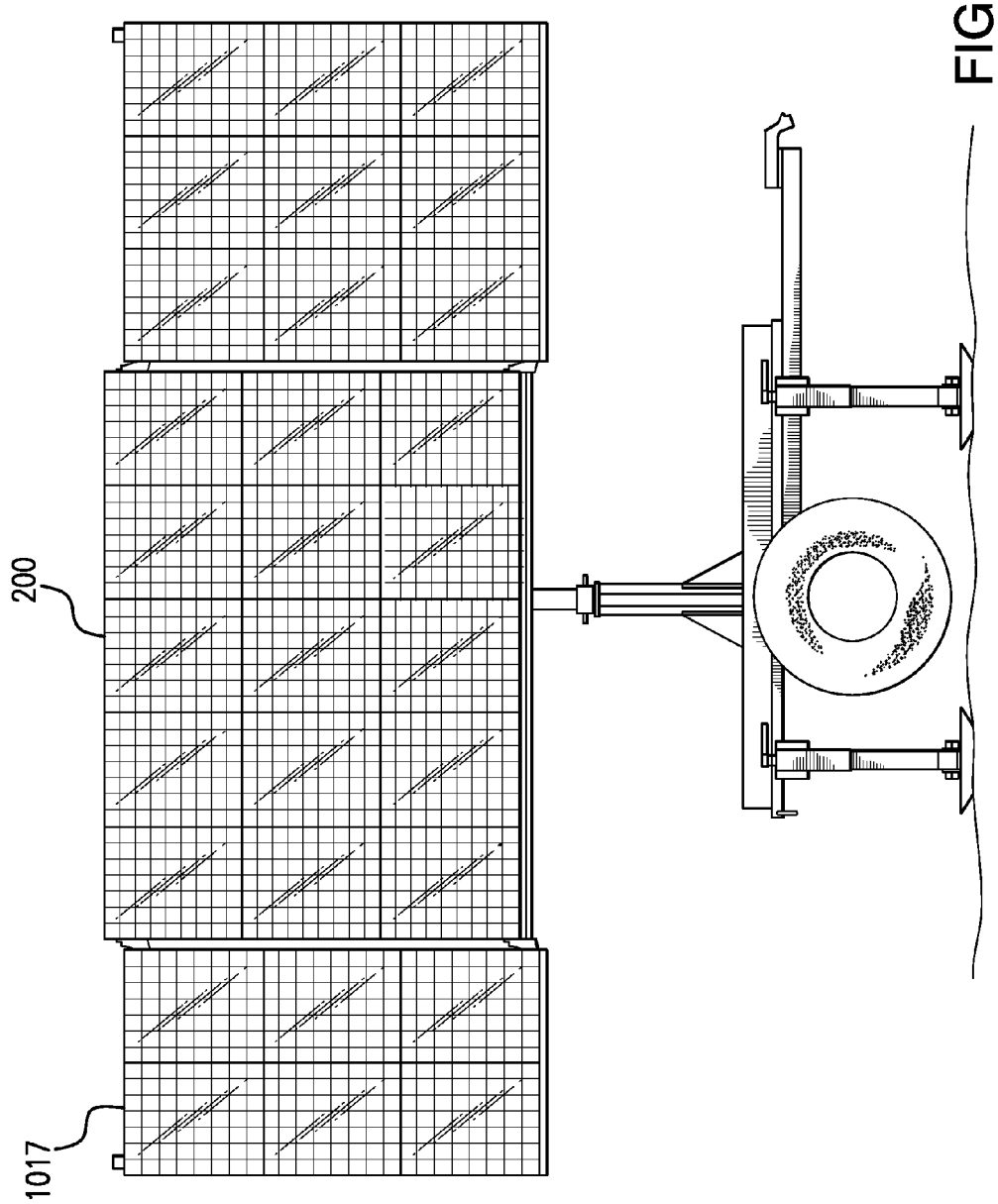
FIG. 9A is a side view of the portable solar power system of FIG. 7 according to one embodiment of the solar cell array panels according to the present disclosure.

FIG. 9A is a side view of the portable solar power system of FIG. 7, in which the solar cell array 1019 is illustrated according to one embodiment of the solar cell array panels according to the present disclosure. The solar cell array 1017 may include a plurality solar cell modules 200 arranged on the surfaces of the non-foldable portion 1011 and those foldable portions 1013 and 1015.

Figure 9B:
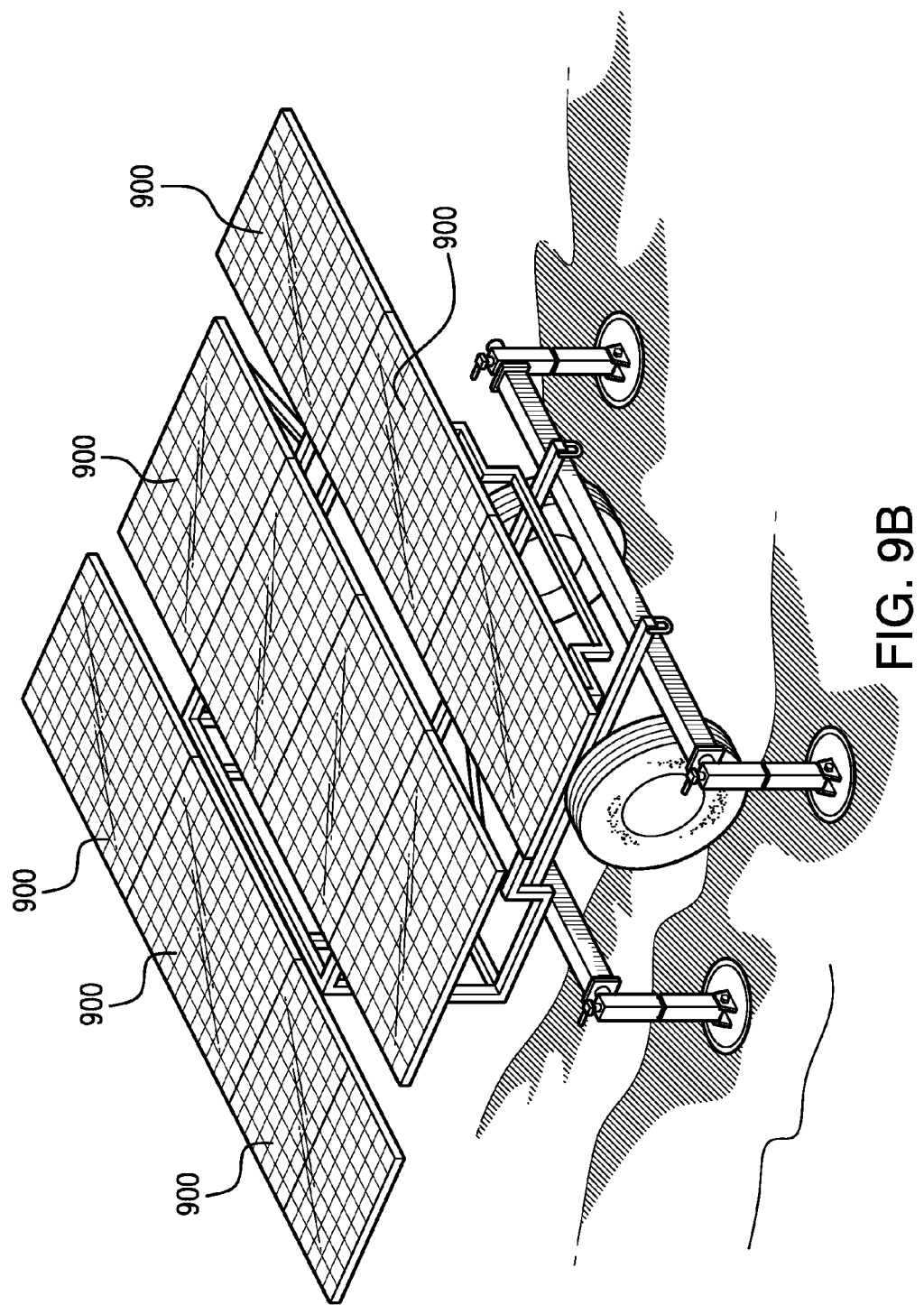
FIG. 9B is a perspective view of a portable solar power system according to another embodiment of the present disclosure.

FIG. 9B is a perspective view of a portable solar power system including a plurality of solar cell array panels 900, according to another embodiment of the present disclosure.

Figure 9C:
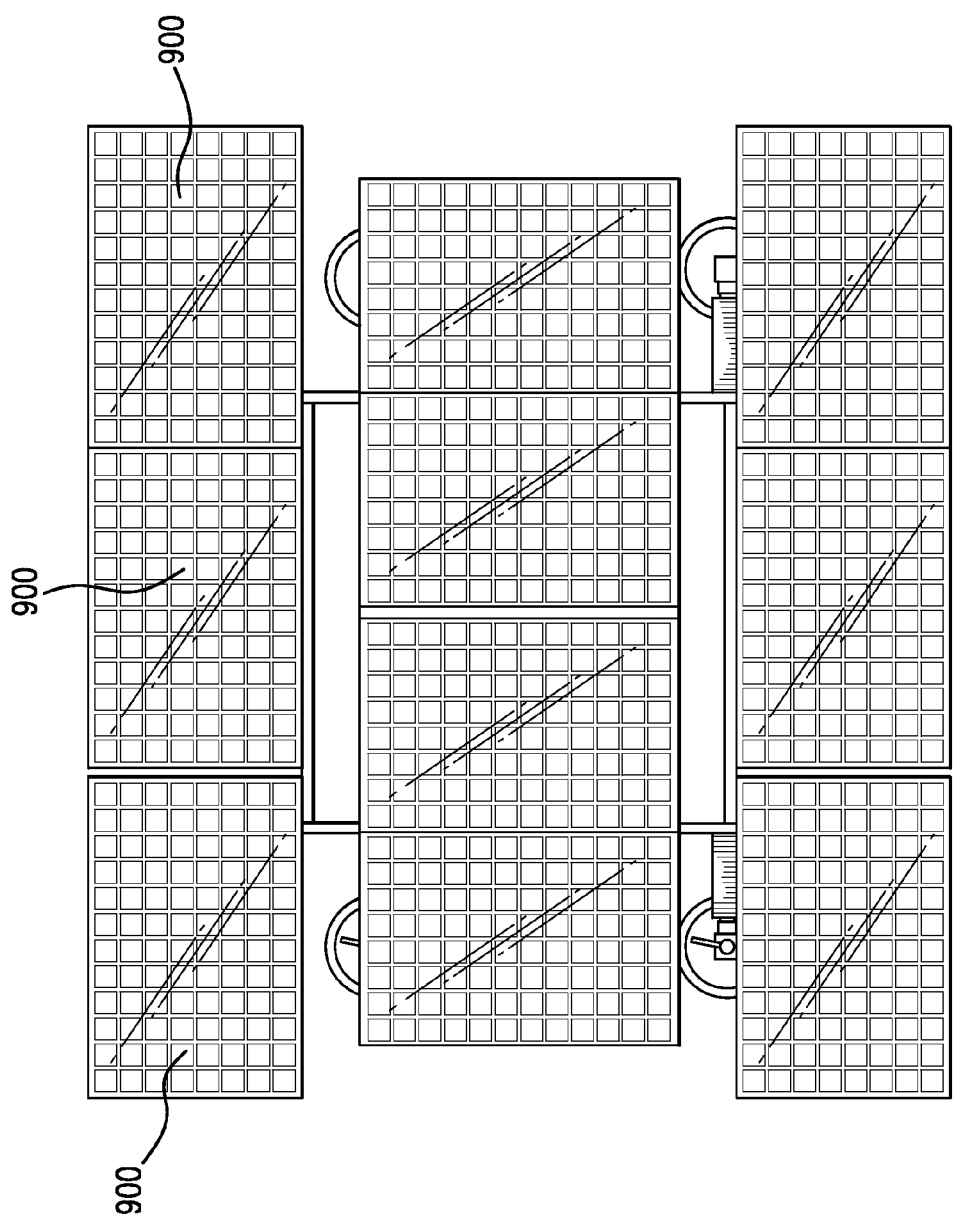
FIG. 9C is a top view of the portable solar power system of FIG. 9B.

FIG. 9C is a top view of the portable solar power system of FIG. 9B depicting the individual silicon solar cells 901 assembled together in each panel 900. The solar cell array panels 900 can be arranged so that a panel can be folded onto another. For example, the solar cell array panels 900 can be mounted onto one or more fordable plates (not specifically shown in FIG. 9B) which can be similar to the above-mentioned foldable plate 101 as illustrated in and described with reference to FIG. 1. As shown in FIG. 9B, the solar cell array panels 900 are mounted onto three (3) foldable plates. In some implementations of such an embodiment, the foldable plate can be not necessarily to be rotated, depending on the applications. FIG. 9B illustrates an example of such implementation. As can be seen from FIG. 9B, the solar cell arrays 900 and the foldable plates can be mounted to an additional frame without need of the above-mentioned rotating mechanism, while the additional frame can be mounted onto the support and transport platform. In some further implementations, the fame can be mounted to a rotating mechanism so that the frame, and thus the solar cell array panels and the foldable plate(s) (if any), can be rotated, for example, around a horizontal axis and/or around a vertical axis by the rotating mechanism. Similarly, the rotating mechanism can be further mounted to the mast so that at least a part of the rotating mechanism and the frame, and thus, the solar cell array panels 900 and the foldable plate(s) (if any) can be supported by the mast. Herein, the rotating mechanism and the mast in some implementations can have structures similar to those shown in, for example, FIGS. 3, 5, and 8.

Figure 10:
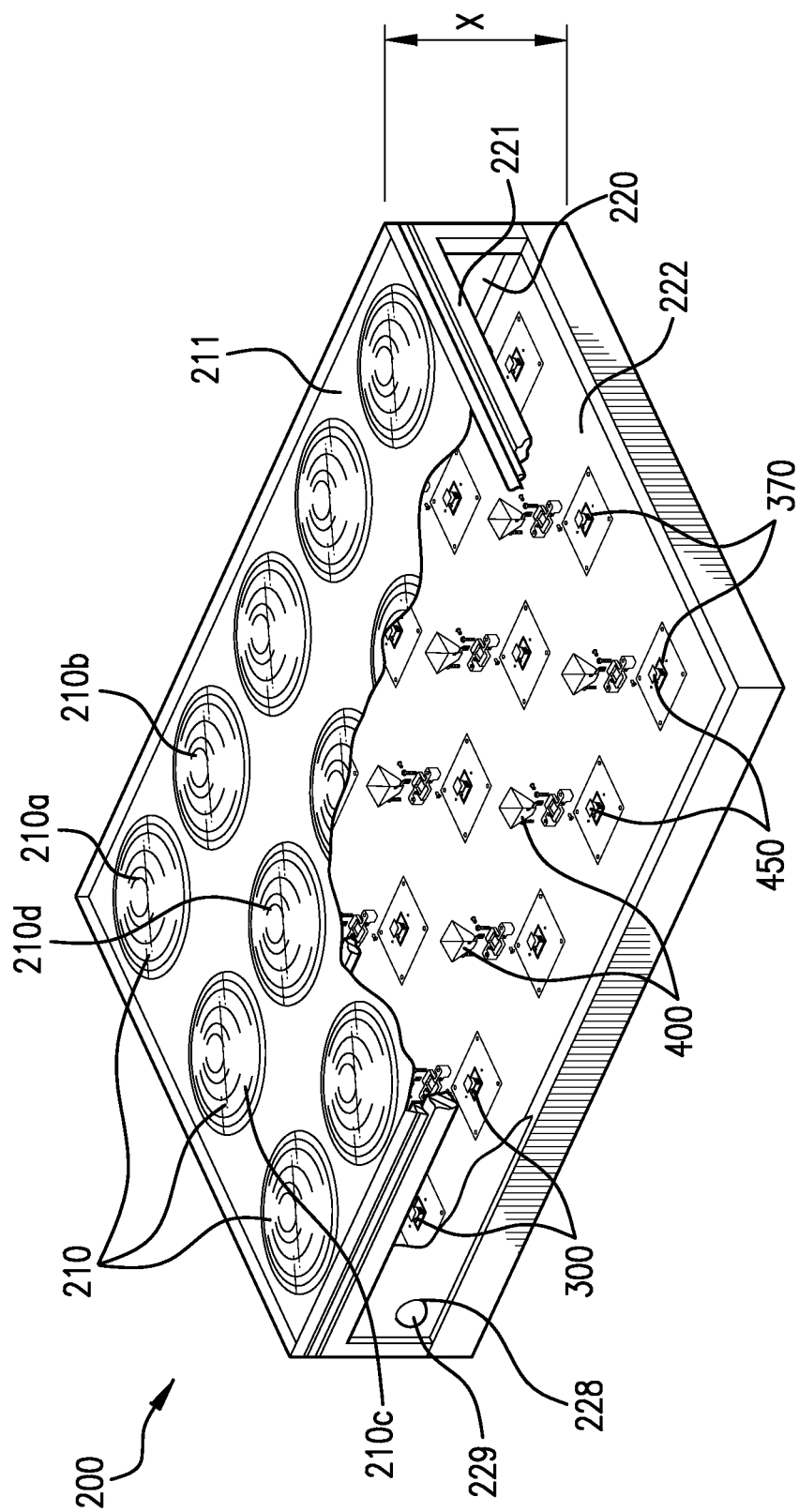
FIG. 10 is partially exploded view of a solar cell module of a solar cell array according to an embodiment of the present disclosure.

FIG. 10 is partially exploded view of a solar cell module 200 of a solar cell array according to an embodiment of the present disclosure. The solar cell module 200 may include an array of lenses 210 and corresponding solar cell receivers 300. Each one of the lenses 210 is aligned with one of the solar cell receivers 300. The solar cell module 200 may include various numbers of lenses 210 and solar cell receivers 300. FIG. 10 illustrates a module 200 with fifteen lenses 210 and solar cell receivers 300 aligned in a 3×5 array.

The lenses 210 are formed on a continuous sheet 211 of optical material (e.g., glass). In some implementations, regions of the sheet 211 not formed into the lenses 210 are made partially or entirely opaque. By forming the lenses 210 out of a continuous sheet 211, costs can be decreased substantially. First, by producing the lenses 210 on large sheets, production costs are decreased. Second, assembly costs are decreased because only one item (i.e., the sheet 211 of lenses) needs to be aligned with the solar cell receivers 300. In this implementation, the sheet 211 lies atop an alignment frame 221 of a housing 220.

One or more vent openings 228 may be positioned in the housing 220. The openings 228 may be positioned to facilitate air flow through the housing 220. In one embodiment, the openings 228 are positioned in the sidewalls of the housing 220 and about 3" below the lenses 210. The size of the openings 228 may vary. In one embodiment, each opening has a circular shape with a diameter of about 1". A cover 229 may extend across the openings 228 and act as a filter to impede the introduction of moisture and debris into the housing 220. The cover 229 may be constructed of a variety of materials, including but not limited to GORETEX, nylon, and polyvinylidene.

The frame 221 may include a plurality of frame alignment elements, such as holes. The alignment elements may be threaded or otherwise adapted to receive a fastener. The sheet 211 may include sheet alignment elements such as pins, screws or other hardware that align and couple with the frame alignment elements. The frame alignment elements and the sheet alignment elements are located such that by coupling the sheet alignment elements with the frame alignment elements, each of the lenses 210 is aligned with a corresponding solar cell receiver 300. The alignment elements are located generally in a center point defined by four of the lenses 210. In one embodiment, an alignment element is located in a center point defined by lenses 210*a*, 210*b*, 210*c*, and 210*d*. Another alignment element may be located in a center point defined by four other lenses 210. This pattern of locating the alignment elements in a center point defined by four lenses can continue along the entire sheet 211.

In some implementations, the floor surface 222 of the housing 220 comprises alignment features that ensure that each of the solar cell receivers 300 is located in a predetermined position. These features may couple with each of the solar cell receivers 300.

In some implementations, each of the lenses 210 is a Fresnel lens. The corresponding solar cell receiver 300 is positioned on the surface 222 at an opposite end of the housing 220. Each of the solar cell receivers 300 includes a corresponding solar cell 370 disposed in the optical path of the corresponding lens 210, i.e., such that the corresponding solar cell 370 receives light that passes through the corresponding lens 210. In some implementations, additional optical elements are employed to place the solar cell in the optical path of the lens. For example, secondary optical elements 400 correspond with each pair of the solar cell receivers 300 and the lenses 210. The secondary optical elements 400 gather the light from the lens 210 and direct it into the solar cell 370 of the solar cell receiver 300. In some implementations, each of the solar cell receivers 300 is provided with a corresponding secondary optical element 400.

While some Fresnel lenses can concentrate more sunlight than some convex lenses, implementations may use any type of lens 210 that concentrates the incident sunlight. For example, any of lenses 210 may take the form of a biconvex lens, a plano-convex lens, or a convex-concave lens. The lenses 210 may also comprise a multi-layer anti-reflective coating. In a module 200, each of the lenses 210 may be the same, or the module 200 may include two or more different lenses 210.

A distance X measured between the sheet 211 comprising the lenses 210 and the solar cells 370 of the corresponding solar cell receivers 300 may be chosen based on the focal length of the lenses 210. In some implementations the housing 220 is arranged so that the solar cell 370 of each respective solar cell receiver 300 is disposed at or about the focal point of the respective lens 210. In some implementations, the focal length of each lens 210 varies, and the housing 220 provides multiple different distances (e.g., those that are greater and/or lesser than the distance X) between the sheet 211 and the surface 222.

The housing 220 and the lens sheet 211 may form an enclosed interior space that protects the solar cell receivers 300 from the environment.

Some implementations of the lenses 210 concentrate incident sunlight to 500 to 1000 times normal concentration (i.e., 500 to 1000 Suns) or more. Other implementations may include other concentrations. Generally speaking, conversion efficiency of solar energy into electricity increases under concentrated illumination. For example, at about 300 Suns, a single solar cell receiver with a 1 cm square solar cell can generate 25 watts or more of electrical power. The amount of electrical power a solar cell receiver can produce can vary depending on, for example, the combination of solar cell characteristics (e.g., size, composition) and properties of the associated optics (e.g., concentration, focus, alignment).

In some implementations, the solar cells 370 of each of the respective solar cell receivers 300 is a triple junction III-V solar cell, with each of the three subcells arranged in series. In applications where multiple solar cell modules 200 are employed, the receivers 300 of the solar cell modules 200 are typically electrically connected together in series. However, other applications may utilize parallel or series-parallel connection. For example, receivers 300 within a given module 200 can be electrically connected together in series, but the modules 200 are connected to each other in parallel.

As previously explained, a secondary optical element ("SOE") 400 may be positioned between the lens 210 and the corresponding solar cell 370. An implementation of an SOE is illustrated in FIG. 2. The SOE 400 is disposed inside the housing 220 of the solar cell module 200 and is generally designed to collect solar energy concentrated by one of the corresponding lenses 210. In some implementations, each of the solar cell receivers 300 has a respective SOE 400. Other modules 200 may include less than each solar cell receiver 300 including an SOE 400.

The SOE 400 comprises an optical element 401 with an optical inlet 402 and an optical outlet 403, a body 404 and mounting tabs 405. The SOE 400 is mounted such that the optical element 401 is disposed above the solar cell 370 of the corresponding solar cell receiver 300. While it may vary depending on the implementation, the SOE 400 is mounted such that the optical outlet 403 is about 0.5 millimeters from the solar cell 370 (e.g., dimension 406 is about 0.5 millimeters). In some implementations, mounting tabs 405 couple to the surface 222 of the housing 220. The SOE 400 may be made of metal, plastic, or glass or other materials.

A further detailed description regarding the components of the solar cell module 200 can be found in the U.S. application Ser. No. 13/035,434 (Publication No. US2011/0155217A1), which is incorporated herein by reference.

It should be understood that the solar cell module and even the solar cell array can be variously implemented, and should not be limited to the precise forms as above described.

In an implementation, each solar cell module 200 may include a Fresnel lens disposed over a single solar cell for concentrating by a factor in excess of 1,000 times of the incoming sunlight onto the solar cell 600×600 micron III-V compound triple junction semiconductor at AM 1.5D solar irradiation with conversion efficiency in excess of 33%. In some embodiments, the output of each module is in excess of 82 watts.

In another implementation, each solar cell module 200 may include: a support; a solar cell mounted on the support and comprising one or more photoelectric units; an optical element positioned over the solar cell on an opposite side from the support, the optical element defining an optical channel and including an enlarged inlet that faces away from the solar cell and a reduced outlet that faces towards the solar cell; a frame positioned over the support and having a height above the support that is greater than the solar cell, the frame extending around and enclosing the solar cell in an interior space; and an encapsulant contained within the interior space between the optical element and the fame and covering portions of the support and the solar cell, the encapsulant having an enlarged fillet height at each of the optical element and the frame.

In another implementation, shown in FIGS. 9B and 9C, the array may comprise ten (10) flat panel silicon solar cell panels 900. In some embodiments, each panel would produce 327 watts.

In another embodiment, the solar cell module is a flat planar array of monocrystalline silicon solar cells.

Figure 15:
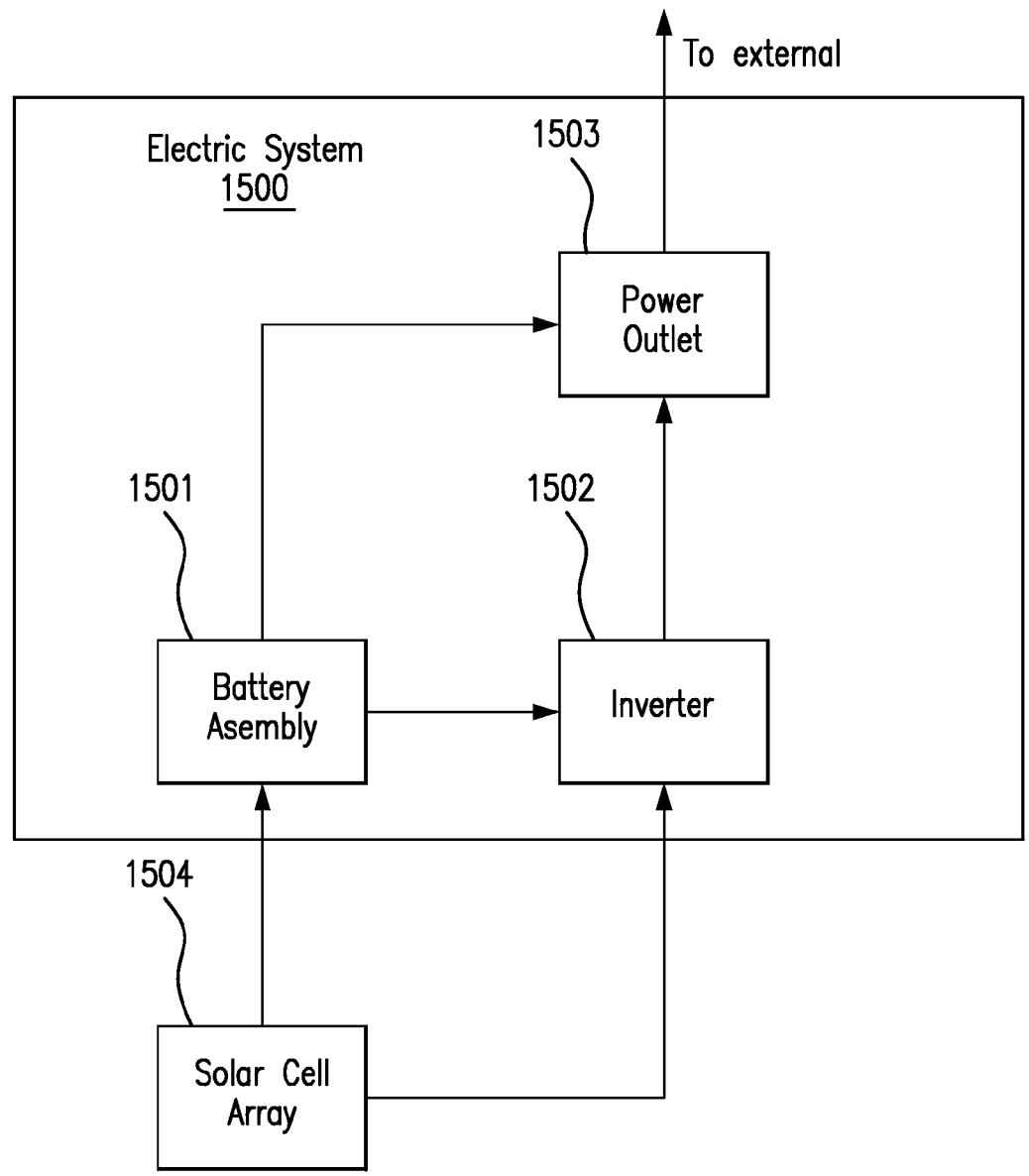
FIG. 15 is a block diagram of the electric system of the portable power system of the present disclosure.

The portable solar power system may further include an electric system. According to an embodiment of the present disclosure, as shown in FIG. 15, the electric system 1500 may include: a battery assembly 1501 for storing power from the solar cell array 1504; an inverter 1502 for converting the DC power from the solar cell arrays or from the battery assembly to AC power; and a power outlet 1503 for outputting the AC power, or the DC power from the battery assembly, to external. Since the electric system is not a particular concern of the present invention, it would not be described in detail. Those skilled in the art would readily understand various implementations of the electric system can be applied in the present invention.

Figure 11:
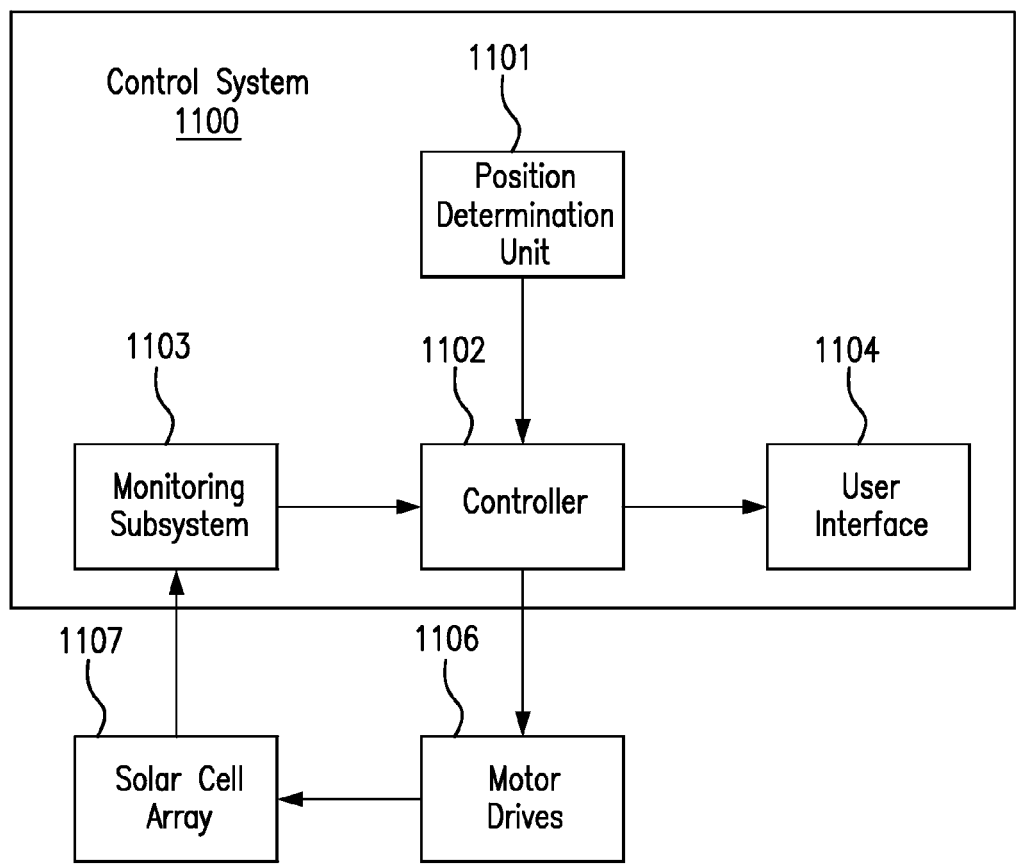
FIG. 11 is an exemplary block diagram illustrating a control system according to an embodiment of the present disclosure.

The portable solar power system may further include a control system 1300 for controlling operations of the solar power system. FIG. 11 is an exemplary block diagram of a control system 1100 according to an embodiment of the present disclosure. The control system 1100 includes a position determination unit 1101 for determining the position of the solar power system. Said position may include latitude and longitude position of the trailer, an optional elevation thereof, and/or the like. In an example, the position determination unit 1101 may comprise a GPS unit which can determine the position of the trailer according to the information from GPS satellite. The control system 1100 further includes a controller 1102. The controller 1102 can be implemented as a CPU, for example, which can predict the positions of the sun during the course of the day using a software algorithm based upon the day and on the latitude and longitudinal position of the trailer. The controller 1102 can further determine the respective actuations for the respective motor drives corresponding to the solar cell array being substantially aligned with the sun during the course of the day. Further, the controller 1102 can actuate the motor drives during the course of the day according to the determined actuations so that the array is substantially aligned with the sun during the course of the day. The controller 1102 may further include a user interface for interaction with the user.

The control system 1100 may further include a monitoring subsystem 1103 for monitoring the operation performance of the collar cell array. For example, the monitoring subsystem 1103 may sample an output characteristic of the solar cell array, for instance, the output power and/or output current from the solar cell array. In such a case, the controller may be further adaptable for controlling the rotating mechanism to orient the solar cell array to tack the sun according to the monitoring of the operation performance of the array.

Figure 12:
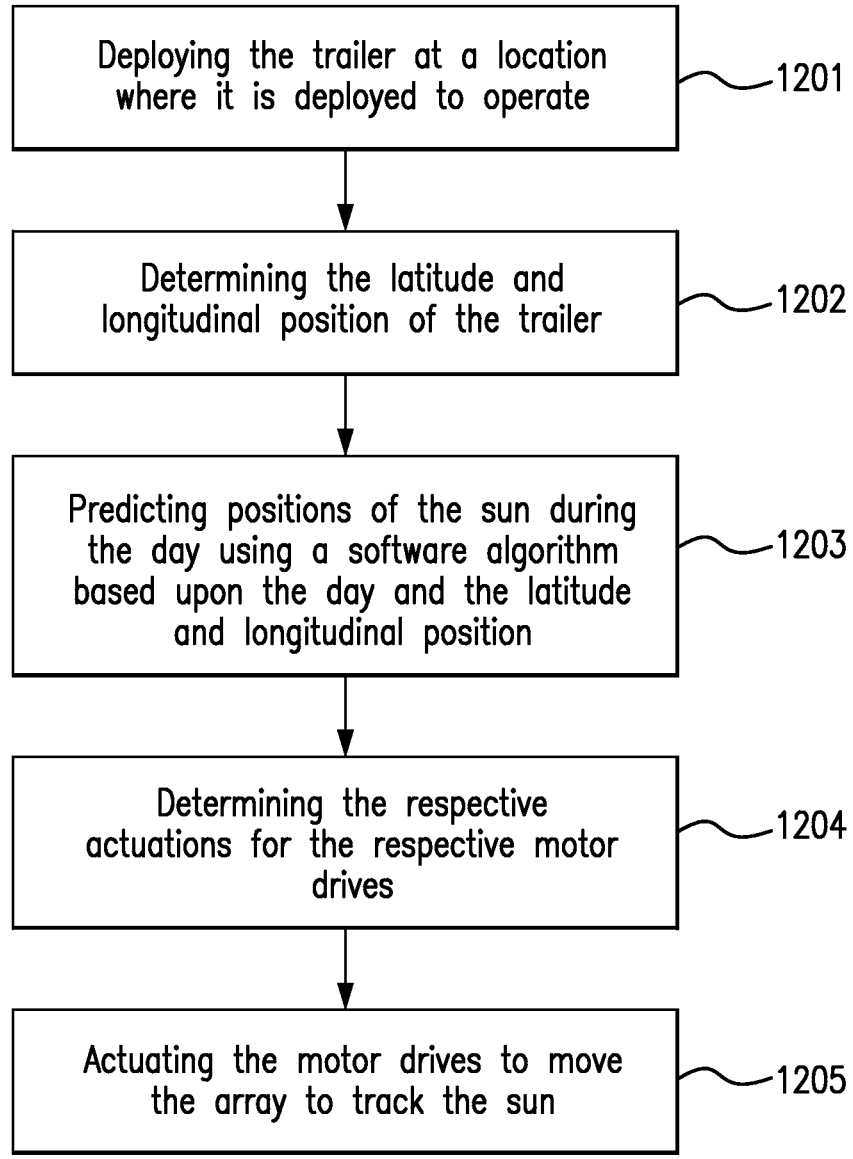
FIG. 12 is a flow chart of a method for operating a solar power system according to an embodiment of the present disclosure.

FIG. 12 is an exemplary flow chart of an automated method for operating a portable solar power system according to an embodiment of the present disclosure. The portable solar power system may include a portable photovoltaic solar cell array that is capable of tracking the sun, the solar cell array including a plurality of solar cells. The portable solar power system may further include two motor drives each of which is operable to adjust a position of the solar cell array about a respective different axis. The solar cell array and motor drives can be mounted on a vehicle trailer. The method can be implemented by a machine, for example, computer, and may include following steps.

At step 1201, the trailer is deployed at a desired location where it is to operate. That is, the solar cell plate is unfolded into a deployed state. In some cases, the ground supports can be stamped onto the grounds to lift the trailer. The array may have a stowed state and a deployed state, and the said deploying of the trailer may further comprise transferring the array from the stowed state to the deployed state, or to say, set the array to a deployed position. In some implementations, said transferring the array from the stowed state to the deployed state may include unfolding the array so that the front surface of the solar cell array is exposed to the ambient environment.

At Step 1202, the current position of the trailer which is deployed is determined, including latitude and longitude position of the trailer, and optional elevation, or the like.

At Step 1203, the positions of the sun during the course of the day can be determined using a software algorithm, based upon the day and on the latitude and longitudinal position of the trailer.

At Step 1204, the respective actuations for the respective motor drives corresponding to the solar cell array being substantially aligned with the sun during the course of the day can be determined.

At Step 1205, the first and second motor drives are actuated during the course of the day according to the actuations determined so that the array is substantially aligned with the sun during the course of the day. Said first and second motor drives may correspond to the actuators of the rotating mechanism in the above described embodiments.

The method may further comprise a step of sampling an output characteristic (for example, the output power and/or the output current) of the array during the course of the day, for example, at a predetermined time or times or periodically, so as to monitor the performance of the solar cell array. The method may further comprise a step of comparing the sampled value with a predetermined value, to determine whether the sample value is substandard. In an implementation, it can be determined the sample value is substandard if the sampled value is below a predetermined value.

In a further implementation, the method may further comprises a realign routine including steps of: moving, using one of the two motor drives, the solar cell array from a first position to a second position by a first predetermined amount to one side of the first position, and sampling the output power and/or current at the second position; moving, using said one of the two motor drive means, the solar cell array to a third position by a second predetermined amount to the other side of the first position, and sampling the output power and/or current at the third position; and determining a fourth position using the samples of output power and/or current at the second and third positions so that the fourth position corresponds to a position which is optimum, that is, a position at which the output power and/or current of the solar cell array has a maximum value. The realignment routine may further comprise a step of move the array to the determined fourth position.

The first predetermined amount may be equal to the second predetermined amount. The said determination of the fourth position comprises calculating a weighted average of distance traveled by the array to the second and third positions using weighting factors corresponding to the sampled output power and/or current at the second and third positions.

Figure 13:
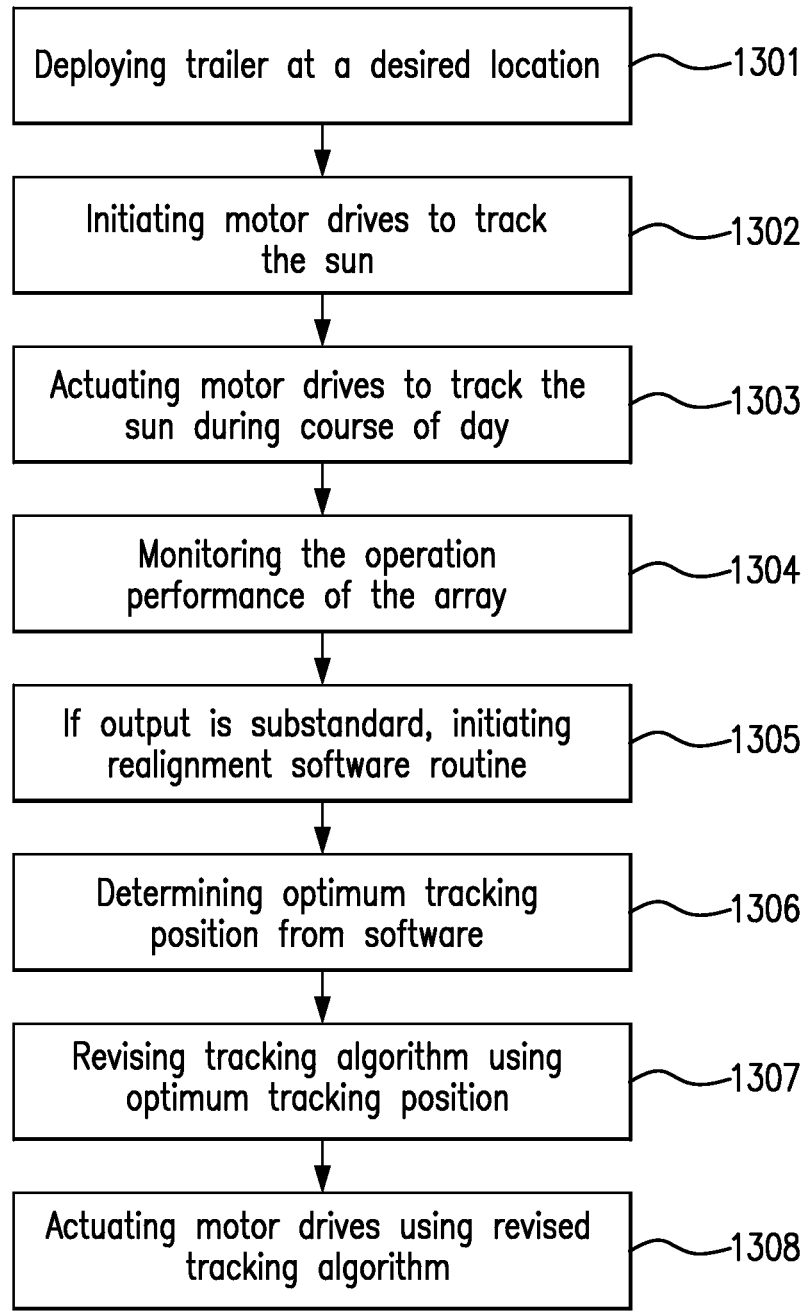
FIG. 13 is a flow chart of a method for operating a solar power system according to another embodiment of the present disclosure.

FIG. 13 is a flow chart of a method for operating the portable solar power system according to another embodiment of the present disclosure.

At step 1301, the trailer is deployed at a desired location where it is to operate.

At step 1302, the motor drives are initiated so that the array is moved from a deployed position to a position such that the solar cell array track the sun, that is, the front plane of the solar cell array is substantially orthogonal to incoming rays of the sun. And, this initiating step can be conducted periodically or at a predetermined time or times during daily operation, for example, after the solar cell plate and thus the solar cell array is reset to the deployed position.

At step 1303 which can be optional in some implementation, the motor drives can be actuated to track the sun during the course of day.

At step 1304, operation performance of the solar power system can be monitored by sampling output characteristic(s) of the solar cell array, for example, periodically or at predetermined time(s). In a particular implementation, the sampled value can be compared with a predetermined value.

At step 1305, if the output characteristic is substandard, that is, the sampled value is below the predetermined value or the position of the array is not optimal, then initiating a realignment routine as above-mentioned.

At step 1306, optimum tracking position can be determined from the realign routine.

The steps 1304 through 1306 can be repeated multiple-times, and the determined optimal tracking positions by those realignment routine can be stored in a memory.

At step 1307, the tracking algorithm can be revised by use of the optimal tracking positions.

At step 1308, the motor drives can be actuated according to the revised algorithm.

As a specific implementation of this embodiment, the method may comprise followings steps:

i. periodically sampling a output characteristic of the solar cell array during the course of the day to determine if the position of the array is optimal by moving, using the first of the two motor drives, the array from a first position to a second position by a first predetermined amount to one side of the first position, and sampling the power output and/or current at the second position;

ii. moving, using the first of the two motor drives, the plurality of solar cells to a third position by a second predetermined amount to the other side of the first position, and sampling the power output and/or current at the third position;

iii. moving, using the second of the two motor drives, the array from a fourth position to a fifth position by a third predetermined amount to one side of the fourth position, and sampling the power output and/or current at the fifth position;

iv. moving, using the second of the two motor drives, the plurality of solar cells to a sixth position by a fourth predetermined amount to the other side of the fifth position, and sampling the power output and/or current at the sixth position;

v. determining a seventh position of the array using the sampled output power and/or current at the second, third, fifth and sixth positions, the seventh position corresponding to a position at which the output characteristic power and/or current has a maximum value;

vi. actuating the first and second motor drives so that the array is moved from the first position to the seventh position; and vii. actuating the first and second motor drives during the remaining course of the day so that the array is continuously moved from the seventh position so that the array is substantially aligned with the sun during the remaining course of the day.

Figure 14A:
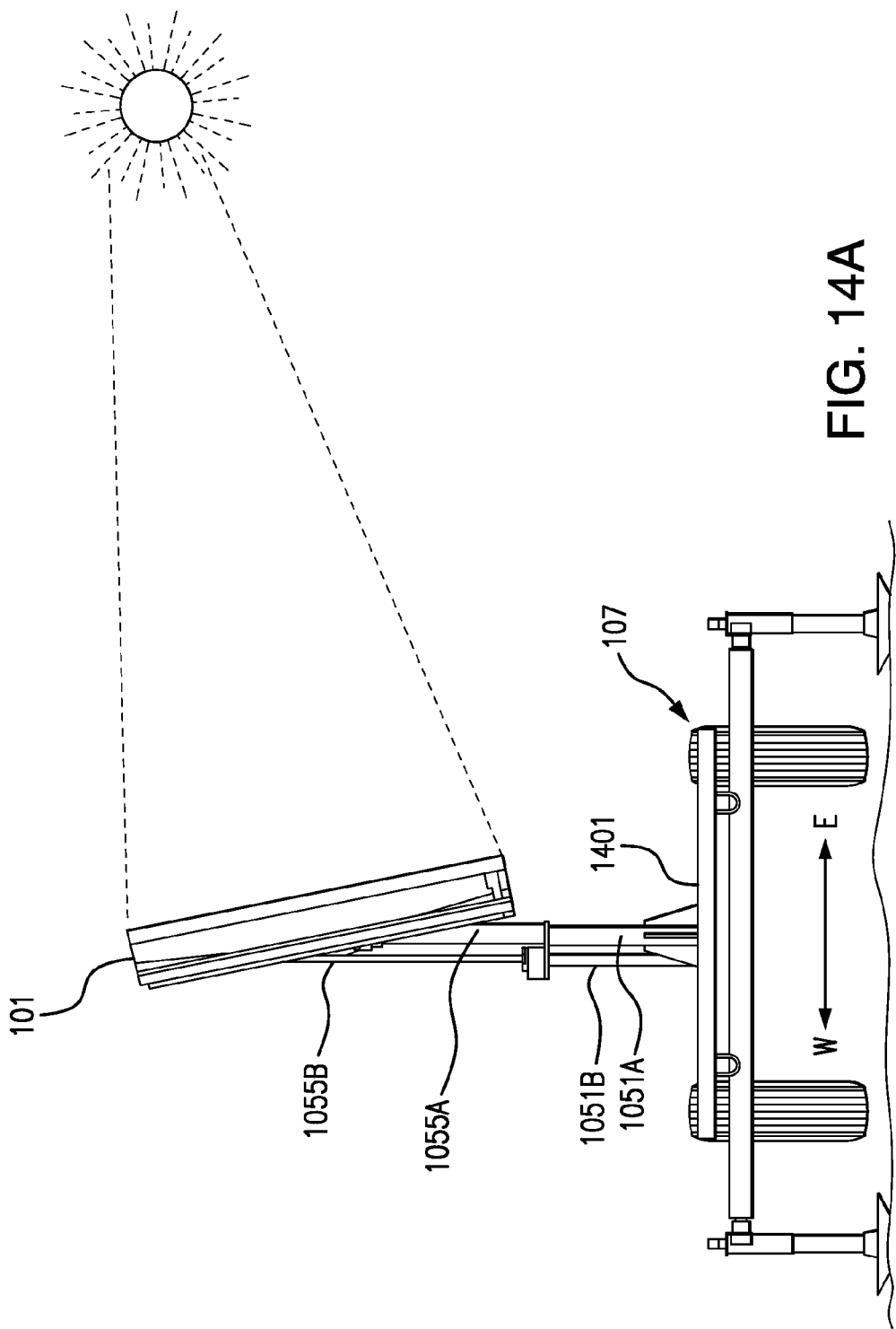
FIGS. 14A and 14B each are exemplary views schematically illustrating that the solar cell array are adjusted to follow the sun according to an embodiment of the present disclosure.
Figure 14B:
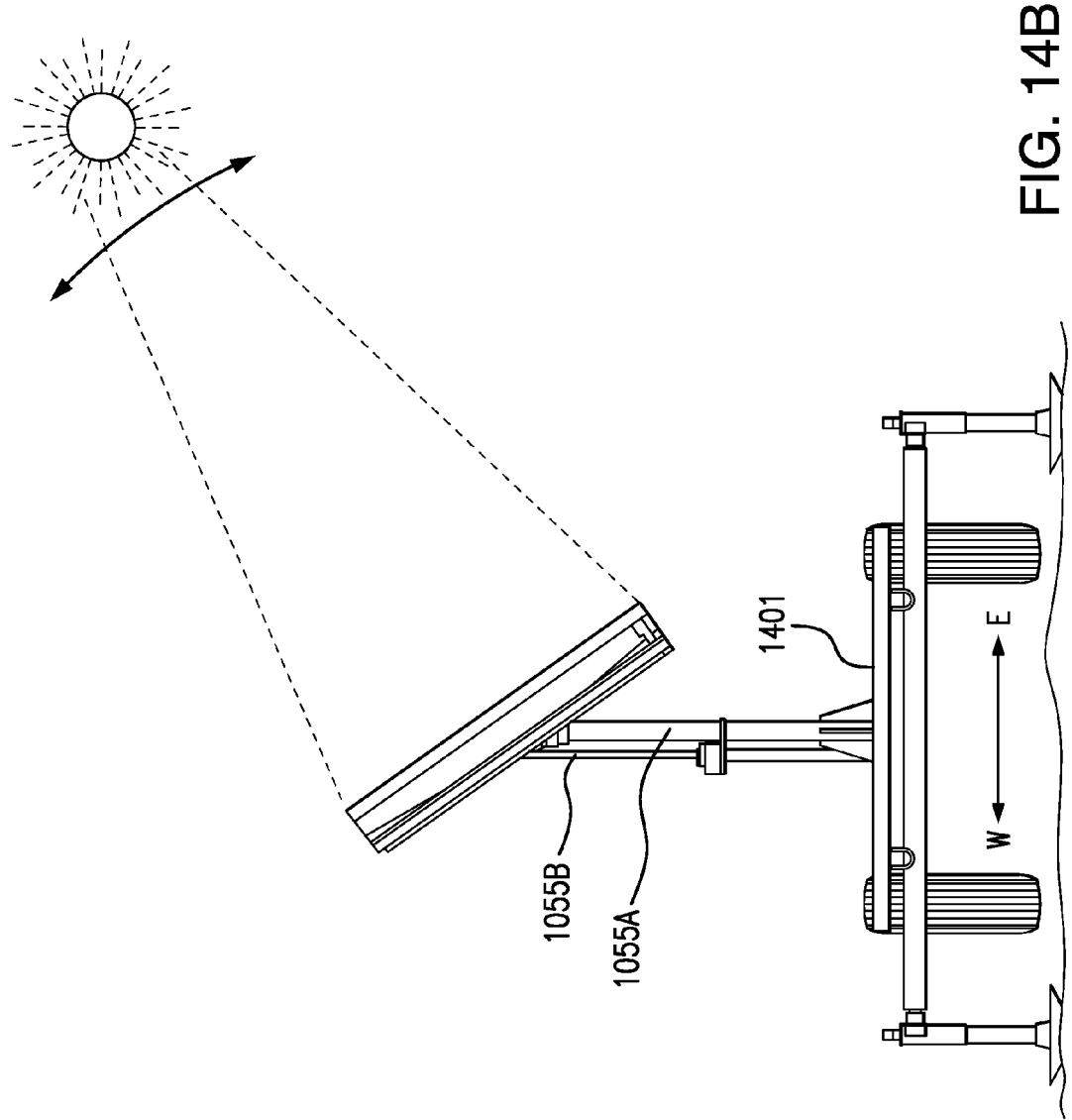

FIGS. 14A and 14B each are exemplary views schematically illustrating that the solar cell array are adjusted to follow the sun, according to an embodiment of the present disclosure.

As shown, the foldable plate, and thus the solar cell array, is capable of effectively and efficiently tracking the sun. FIG. 14A schematically illustrating such a case that the sun goes beyond the horizon with a relative small angle, the solar cell plate is actuated to track the sun, that is, the front surface of the solar cell array is substantially perpendicular to the incoming sunlight. Similarly, FIG. 14B schematically illustrating such a case that the sun goes beyond the horizon with a relative large angle, the solar cell plate is also actuated to track the sun.

According to this embodiment, the first portion 1051 of the mast 105 is directly coupled or fixed to a part of the rotating mechanism 1401. In such an embodiment, the rotating mechanism 1401 may include a stationary first portion coupled to the support and transport platform 107, for example, to the base 1071 of the platform 107. The rotating mechanism 1401 may further comprise a rotatable second portion operatively coupled to the stationary first portion and capable of being rotated about its rotating axis (for example, vertical symmetric axis). The first portion 1051 of the mast 105 can be coupled or fixed to the rotatable second portion of the rotating mechanism 1401. The rotating mechanism 1401 may further comprise an actuator (not shown) for actuating the rotatable second portion to rotate.

In such an embodiment, the first portion 1051 of the mast 105 may include a first member 1051A which is hollow and of a column-like shape and a parallel second member 1051B which is hollow and of a cylinder-like shape. In a specific implementation, the first member 1051A can be hollow, quadrangular prism, and the second member 1051B can be a hollow cylinder. The second portion 1055 of the mast 105 may further include a third member 1055A which is partly fitted in the first member 1051A and a fourth member 1055B which is partly fitted in the second member 1051B. In a specific implementation, the third member and the fourth member may be shafts which are suitable to be fitted into the columns 1051A and 1051B, respectively. The third member 1055A and the fourth member 1055B each can be coupled to the opposite surface of the non-foldable portions at different locations, for example, with hinges (not shown) so as to control a tilt angle of the foldable plate with respect to the vertical direction.

According to various embodiments of the present disclosure, the solar cell array can be adjusted in two different axes, therefore it can be freely oriented to track the sun so that the efficiency and effectiveness of the array can be improved as compared with the prior art. Further, the portable solar power system can be easily deployed at locations with various topographies while maintaining a good tracking performance to the sun.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

In the claims, the word 'comprising' or 'having' does not exclude the presence of other elements or steps then those listed in a claim. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The present invention can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the invention.

Although some specific embodiments of the present invention have been demonstrated in detail with examples, it should be understood by a person skilled in the art that the above examples are only intended to be illustrative but not to limit the scope of the present invention. It should be understood that the above embodiments can be modified without departing from the scope and spirit of the present invention which are to be defined by the attached claims.

The invention claimed is:

1. A portable solar power system, comprising:
   a foldable plate including a non-foldable portion and at least one foldable portion with respective to the non-foldable portion, both of which have respective surfaces on which solar cells of a solar cell array are mounted and respective opposite surfaces;
   a rotating mechanism for rotating the foldable plate in at least one plane;
   a mast for supporting at least a part of the rotating mechanism and the foldable plate, the mast including a first portion and a second portion coupled to the first portion, wherein the first portion of the mast includes a first member which is hollow and of a column-like shape and a parallel second member which is hollow and of a cylinder-like shape, wherein the second portion of the mast includes a third member which is partly fitted in the first member and a fourth member which is partly fitted in the second member, and wherein the third member and the fourth member each are coupled to the opposite surface of the non-foldable portions at different locations with hinges so as to control a tilt angle of the foldable plate; and
   a support and transport platform for supporting the foldable plate, the rotating mechanism and the mast, and for motion of the portable solar power system,
   wherein the rotating mechanism includes:
   a stationary first portion coupled to the support and transport platform,
   a rotatable second portion operatively coupled to the stationary first portion and capable of being rotated about a rotating axis, the rotatable second portion being coupled to the first portion of the mast, and
   an actuator for actuating the rotatable second portion to rotate.

2. The portable solar power system of claim 1, wherein a part of the solar cell array which is mounted on the non-foldable portion and a part of the solar cell array which is mounted on the foldable portion face each other when the at least one foldable portion is folded.

3. The portable solar power system of claim 1, wherein the second portion of the mast is capable of being reciprocated respective to the first portion so that the mast is capable of reciprocating at least a part of the rotating mechanism and the foldable plate up and down, and
wherein the mast further includes an actuator for actuating the second portion thereof.

4. The portable solar power system of claim 1, wherein the first portion of the mast is coupled to the support and transport platform, and
wherein the rotating mechanism includes:
a stationary first portion coupled to the second portion of the mast,
a rotatable second portion partly mounted within the stationary first portion and capable of being rotated about a first axis,
a rotatable beam coupled to the rotatable second portion, which is capable of being rotated about a different second axis and is fixed to a ridge or frame fixed onto an opposite surface of the non-foldable portion of the foldable plate, and
actuators for actuating the rotatable second portion and the rotatable beam to rotate.

5. The portable solar power system of claim 1, wherein the support and transport platform is a trailer including:
a base on and above which the mast, the rotating mechanism and the foldable plate are mounted,
a trailer hitch coupled to the base for towing the trailer,
wheels operatively coupled to the base; and
adjustable ground supports coupled to the base for supporting the trailer when the trailer is in a standalone state,
wherein the adjustable ground supports each include:
a fix rod coupled to the base,
a support rod coupled to the fix rod and is capable of being bended with respect to the fix rod so as to support the trailer.

6. The portable solar power system of claim 1, wherein the support and transport platform is a self-propelled vehicle including:
a base on and above which the mast, the rotating mechanism and the foldable plate are mounted.

7. The portable solar power system of claim 1, wherein the solar cell array is capable of producing DC power, and wherein the portable solar power system further comprises an electric system including:
a battery assembly for storing power from the solar cell array;
an inverter for converting the DC power from the solar cell array or from the battery assembly to AC power; and
a power outlet for outputting the AC power, or the DC power from the battery assembly, to external.

8. The portable solar power system of claim 1, wherein the solar cell array comprises a plurality of solar cell modules, each module including (i) an array of Fresnel lenses disposed over a respective array of III-V compound semiconductor solar cells for concentrating by a factor in excess of 500 times of incoming sunlight onto the solar cell; or (ii) a flat array of silicon solar cells.

9. The portable solar power system of claim 1, wherein the solar cell array comprises a plurality of solar cell modules, each module including:
a support;
a solar cell mounted on the support and comprising one or more photoelectric units;
an optical element positioned over the solar cell on an opposite side from the support, the optical element defining an optical channel and including an enlarged inlet that faces away from the solar cell and a reduced outlet that faces towards the solar cell;
a frame positioned over the support and having a height above the support that is greater than the solar cell, the frame extending around and enclosing the solar cell in an interior space; and
an encapsulant contained within the interior space between the optical element and the fame and covering portions of the support and the solar cell, the encapsulant having an enlarged fillet height at each of the optical element and the frame.

10. The portable solar power system of claim 1, further comprising a control system including:
a position determination unit for determining a current position of the portable solar power system being deployed; and
a controller adaptable for:
predicting positions of the sun during day at the current position;
determining respective actuations for the rotating mechanism according to the predicted positions of the sun; and
controlling the rotating mechanism to orient the solar cell array to track the sun according to the determined actuations.

11. The portable solar power system of claim 10, wherein the control system further comprises a monitoring subsystem for monitoring the operation performance of the array, and
wherein the controller is further adaptable for controlling the rotating mechanism to orient the solar cell array to track the sun according to the monitoring of the operation performance of the array.

12. A portable solar power system, comprising:
a foldable plate including a non-foldable portion and at least one foldable portion with respective to the non-foldable portion, both of which have respective surfaces on which solar cells of a solar cell array are mounted and respective opposite surfaces;
a rotating mechanism for rotating the foldable plate in at least one plane;
a mast for supporting at least a part of the rotating mechanism and the foldable plate, the mast including a first portion and a second portion coupled to the first portion, wherein the first portion of the mast includes a first member which is hollow and of a column-like shape and a parallel second member which is hollow and of a cylinder-like shape, wherein the second portion of the mast includes a third member which is partly fitted in the first member and a fourth member which is partly fitted in the second member, and wherein the third member and the fourth member each are coupled to the opposite surface of the non-foldable portions at different locations with hinges so as to control a tilt angle of the foldable plate; and
a support and transport platform for supporting the foldable plate, the rotating mechanism and the mast, and for motion of the portable solar power system.

13. The portable solar power system of claim 12,
wherein a part of the solar cell array which is mounted on the non-foldable portion and a part of the solar cell array which is mounted on the foldable portion face each other when the at least one foldable portion is folded.

14. The portable solar power system of claim 12, wherein the second portion of the mast is capable of being reciprocated respective to the first portion so that the mast is capable of reciprocating at least a part of the rotating mechanism and the foldable plate up and down, and wherein the mast further includes an actuator for actuating the second portion thereof.

15. The portable solar power system of claim 12, wherein the first portion of the mast is coupled to the support and transport platform, and wherein the rotating mechanism includes:
a stationary first portion coupled to the second portion of the mast,
a rotatable second portion partly mounted within the stationary first portion and capable of being rotated about a first axis,
a rotatable beam coupled to the rotatable second portion, which is capable of being rotated about a different second axis and is fixed to a ridge or frame fixed onto an opposite surface of the non-foldable portion of the foldable plate, and
actuators for actuating the rotatable second portion and the rotatable beam to rotate.

16. The portable solar power system of claim 12, wherein the solar cell array is capable of producing DC power, and wherein the portable solar power system further an electric system including:
a battery assembly for storing power from the solar cell array;
an inverter for converting the DC power from the solar cell array or from the battery assembly to AC power; and
a power outlet for outputting the AC power, or the DC power from the battery assembly, to external.

17. The portable solar power system of claim 12, wherein the solar cell array comprises a plurality of solar cell modules, each module including (i) an array of Fresnel lenses disposed over a respective array of III-V compound semiconductor solar cells for concentrating by a factor in excess of 500 times of incoming sunlight onto the solar cell; or (ii) a flat array of silicon solar cells.

18. The portable solar power system of claim 12, wherein the solar cell array comprises a plurality of solar cell modules, each module including:
a support;
a solar cell mounted on the support and comprising one or more photoelectric units;
an optical element positioned over the solar cell on an opposite side from the support, the optical element defining an optical channel and including an enlarged inlet that faces away from the solar cell and a reduced outlet that faces towards the solar cell;
a frame positioned over the support and having a height above the support that is greater than the solar cell, the frame extending around and enclosing the solar cell in an interior space; and
an encapsulant contained within the interior space between the optical element and the fame and covering portions of the support and the solar cell, the encapsulant having an enlarged fillet height at each of the optical element and the frame.

19. The portable solar power system of claim 12, further comprising a control system including:
a position determination unit for determining a current position of the portable solar power system being deployed; and
a controller adaptable for:
predicting positions of the sun during day at the current position;
determining respective actuations for the rotating mechanism according to the predicted positions of the sun; and
controlling the rotating mechanism to orient the solar cell array to track the sun according to the determined actuations.

20. The portable solar power system of claim 19, wherein the control system further comprises a monitoring subsystem for monitoring the operation performance of the array, and wherein the controller is further adaptable for controlling the rotating mechanism to orient the solar cell array to track the sun according to the monitoring of the operation performance of the array.

\* \* \* \* \*